(12) United States Patent
Tian et al.

(10) Patent No.: US 12,292,660 B2
(45) Date of Patent: May 6, 2025

(54) DISPLAY MODULE WITH CIRCUIT BOARDS

(71) Applicant: BOE TECHNOLOGY GROUP CO., LTD., Beijing (CN)

(72) Inventors: Li Tian, Beijing (CN); Jian Xu, Beijing (CN); Qiujie Su, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/620,022

(22) Filed: Mar. 28, 2024

(65) Prior Publication Data
US 2024/0241410 A1  Jul. 18, 2024

Related U.S. Application Data

(63) Continuation of application No. 17/427,616, filed as application No. PCT/CN2020/125417 on Oct. 30, 2020, now Pat. No. 12,032,250.

(51) Int. Cl.
*G02F 1/1345* (2006.01)
*G02F 1/1333* (2006.01)
(Continued)

(52) U.S. Cl.
CPC ...... *G02F 1/13452* (2013.01); *G02F 1/13338* (2013.01); *G02F 1/133512* (2013.01);
(Continued)

(58) Field of Classification Search
CPC ............ G02F 1/13452; G02F 1/13338; G02F 1/133512; G02F 1/13439; G02F 1/1347;
(Continued)

(56) References Cited

U.S. PATENT DOCUMENTS 11,003,035 B2    5/2021   Liu et al.
11,169,413 B2   11/2021   Liu et al.
(Continued)

FOREIGN PATENT DOCUMENTS

CN    102096221 A    6/2011
CN    102279480 A   12/2011
(Continued)

OTHER PUBLICATIONS

International Search Report and Written Opinion dated Jul. 27, 2021 received in International Application No. PCT/CN2020/125417.
(Continued)

*Primary Examiner* — Tracie Y Green
(74) *Attorney, Agent, or Firm* — Scully, Scott, Murphy & Presser, P.C.

(57) ABSTRACT

A display module is provided. The display module includes: a display panel, a light control panel, at least one first circuit board for the display panel, and at least one second circuit board for the light control panel. The display panel and the light control panel) are stacked, the display panel is on a light-emitting side of the light control panel, a light-emitting surface of the display panel is on a first surface, and at least part of an orthographic projection of any one of the at least one first circuit board on the first surface does not overlap with an orthographic projection of the at least one second circuit board on the first surface in a direction perpendicular to the first surface.

19 Claims, 19 Drawing Sheets

(51) Int. Cl.
    *G02F 1/1335*     (2006.01)
    *G02F 1/1343*     (2006.01)
    *G02F 1/1347*     (2006.01)
    *G06F 3/041*     (2006.01)
    *G06F 3/044*     (2006.01)
    *H05K 1/02*     (2006.01)
    *H05K 1/14*     (2006.01)

(52) U.S. Cl.
    CPC ........ *G02F 1/13439* (2013.01); *G02F 1/1347* (2013.01); *G06F 3/0412* (2013.01); *G06F 3/0446* (2019.05); *H05K 1/028* (2013.01); *H05K 1/147* (2013.01); *G02F 2203/48* (2013.01); *H05K 2201/10136* (2013.01)

(58) Field of Classification Search
    CPC ........... G02F 2203/48; G02F 1/136286; G06F 3/0412; G06F 3/0446; G06F 3/04164; G06F 3/0443; H05K 1/028; H05K 1/147; H05K 2201/10136; H05K 3/368; H05K 2201/041; H05K 2201/056; H05K 2201/058
    See application file for complete search history.

(56) References Cited

U.S. PATENT DOCUMENTS

| | | | |
|---|---|---|---|
| 11,467,445 | B2 | 10/2022 | Liu et al. |
| 2011/0141042 | A1* | 6/2011 | Kim ...................... G06F 3/0412 345/173 |
| 2011/0304571 | A1 | 12/2011 | Kim et al. |
| 2016/0291382 | A1 | 10/2016 | Chai |
| 2020/0004078 | A1 | 1/2020 | Yabuki |
| 2023/0021887 | A1* | 1/2023 | Oonishi ............... H05K 5/0247 |

FOREIGN PATENT DOCUMENTS

| | | |
|---|---|---|
| CN | 102902121 A | 1/2013 |
| CN | 203535608 U | 4/2014 |
| CN | 104698636 A | 6/2015 |
| CN | 105745570 A | 7/2016 |
| CN | 107833560 A | 3/2018 |
| CN | 208488632 U | 2/2019 |
| CN | 110515246 A | 11/2019 |
| CN | 110989855 A | 4/2020 |
| CN | 111413816 A | 7/2020 |
| JP | 2002072243 A | 3/2002 |
| JP | 200765152 A | 3/2007 |
| JP | 2007093680 A | 4/2007 |
| KR | 101996984 B1 | 7/2019 |
| KR | 20190090417 A | 8/2019 |

OTHER PUBLICATIONS

Notice of Allowance dated Feb. 28, 2024 received in U.S. Appl. No. 17/427,616.

Office Action dated Aug. 30, 2023 received in U.S. Appl. No. 17/427,616.

* cited by examiner

DISPLAY MODULE WITH CIRCUIT BOARDS

This application is a continuation application of American patent application Ser. No. 17/427,616, which is a national phase of International Application No. PCT/CN2020/125417, filed on Oct. 30, 2020, the entire disclosure of which is incorporated herein by reference as part of the present application.

TECHNICAL FIELD

Embodiments of the present disclosure relate to a display module.

BACKGROUND

A liquid crystal display device includes a backlight module (a backlight unit) and a liquid crystal panel. The backlight module is arranged on a non-display side of the liquid crystal panel to provide a light source for the display operation of the display panel. The liquid crystal panel includes a polarizer, an array substrate, an opposite substrate, and a liquid crystal molecule layer filled between the array substrate and the opposite substrate. The liquid crystal display device allows liquid crystal molecules in the liquid crystal molecule layer to deflect by forming an electric field between the array substrate and the opposite substrate, and the deflected liquid crystal molecules cooperate with the polarizer to form a liquid crystal light valve. Since the liquid crystal molecule layer itself does not emit light, a backlight module is needed to realize the display function. With continuous development of display technology, users have put forward higher and higher requirements for the contrast and brightness uniformity of display devices.

SUMMARY

At least one embodiment of the present disclosure provides a display module, which comprises: a display panel, a light control panel, at least one first circuit board for the display panel, and at least one second circuit board for the light control panel. The display panel and the light control panel are stacked, the display panel is on a light-emitting side of the light control panel, a light-emitting surface of the display panel is on a first surface, and at least part of an orthographic projection of any one of the at least one first circuit board on the first surface does not overlap with an orthographic projection of the at least one second circuit board on the first surface in a direction perpendicular to the first surface.

For example, in the display module provided by at least one example, the display further comprises: at least one first flexible circuit board and at least one second flexible circuit board. A first end of the at least one first flexible circuit board is bonded to the display panel, and a second end of the at least one first flexible circuit board is bonded to the at least one first circuit board; a first end of the at least one second flexible circuit board is bonded to the light control panel, and a second end of the at least one second flexible circuit board is bonded to the at least one second circuit board; the at least one first circuit board and the at least one second circuit board are on a side of the light control panel away from the display panel; and the orthographic projection of any one of the at least one first circuit board on the first surface does not overlap with the orthographic projection of the at least one second circuit board on the first surface in the direction perpendicular to the first surface.

For example, in the display module provided by at least one example, each of the at least one first flexible circuit board comprises a plurality of first wires, and the plurality of first wires are respectively electrically connected to a first number of first signal lines comprised in the display panel; each of the at least one second flexible circuit board comprises a plurality of second wires, and the plurality of second wires are respectively electrically connected to a second number of second signal lines comprised in the light control panel; and a number of the plurality of first wires is greater than or equal to a number of the plurality of second wires.

For example, in the display module provided by at least one example, the number of the plurality of first wires is substantially equal to three times the number of the plurality of second wires; a width of each of the at least one first flexible circuit board in a first direction is greater than or equal to a width of each of the at least one second flexible circuit board in the first direction; and each of the first number of first signal lines extends in a second direction crossing the first direction as a whole.

For example, in the display module provided by at least one example, the at least one first circuit board and the at least one second circuit board respectively extend in a first direction; an orthographic projection of the at least one first circuit board on the first surface at least partially overlaps with the orthographic projection of the at least one second circuit board on the first surface in a second direction crossing the first direction; and the orthographic projection of the at least one first circuit board on the first surface and the orthographic projection of the at least one second circuit board on the first surface are arranged at an interval in the second direction.

For example, in the display module provided by at least one example, a length of the at least one first flexible circuit board is smaller than a length of the at least one second flexible circuit board.

For example, in the display module provided by at least one example, a difference between the length of the at least one second flexible circuit board and the length of the at least one first flexible circuit board is greater than or equal to a width of the at least one first circuit board in the second direction.

For example, in the display module provided by at least one example, the orthographic projection of any one of the at least one first flexible circuit board on the first surface and the orthographic projection of the at least one second flexible circuit board on the first surface are arranged at an interval in the first direction.

For example, in the display module provided by at least one example, the at least one first flexible circuit board comprises a plurality of first flexible circuit boards arranged side by side in the first direction; the at least one second flexible circuit board comprises a plurality of second flexible circuit boards arranged side by side in the first direction; and a number of the plurality of first flexible circuit boards is greater than or equal to a number of the plurality of second flexible circuit boards.

For example, in the display module provided by at least one example, at least two of the first flexible circuit boards are provided between two adjacent second flexible circuit boards in the first direction.

For example, in the display module provided by at least one example, the at least one first circuit board comprises a plurality of first circuit boards arranged side by side in the first direction; the at least one second circuit board comprises a plurality of second circuit boards arranged side by side in the first direction; a number of first flexible circuit boards bonded to each of the plurality of first circuit boards is equal to a number of second flexible circuit boards bonded to each of the plurality of second circuit boards; and a length of each of the plurality of first circuit boards in the first direction is smaller than a length of each of the plurality of second circuit boards in the first direction.

For example, in the display module provided by at least one example, the display panel comprises a plurality of first connection lines and a plurality of first signal lines; each of the plurality of first connection lines comprises a first wire portion, a second wire portion, and a third wire portion which are sequentially connected; the first wire portion is electrically connected to a corresponding first signal line, and the third wire portion is electrically connected to a corresponding first flexible circuit board; the light control panel comprises a plurality of second connection lines and a plurality of second signal lines; each of the plurality of second connection lines comprises a fourth wire portion, a fifth wire portion, and a sixth wire portion which are sequentially connected; the fourth wire portion is electrically connected to a corresponding second signal line, and the sixth wire portion is electrically connected to a corresponding second flexible circuit board; lengths of second wire portions of at least part of the plurality of first connection lines in the first direction changes at a first change rate; lengths of fifth wire portions of at least part of the plurality of second connection lines in the first direction changes at a second change rate; the first change rate is smaller than the second change rate; and each of the plurality of first signal lines extends in a second direction crossing the first direction as a whole.

For example, in the display module provided by at least one example, each of the first wire portion, the third wire portion, the fourth wire portion, and the sixth wire portion extends in the second direction as a whole, and each of the second wire portion and the fifth wire portion extends in a direction crossing both the first direction and the second direction as a whole.

For example, in the display module provided by at least one example, the display panel further comprises a first common electrode in a peripheral region of the display module; the light control panel further comprises a second common electrode in the peripheral region of the display module; the display module comprises a first side and a second side opposite to each other in the first direction; two outermost first connection lines among the plurality of first connection lines comprise a first connection line on the first side and a first connection line on the second side; two outermost second connection lines among the plurality of second connection lines comprise a second connection line on the first side and a second connection line on the second side; a distance between a second wire portion of the first connection line on the first side and an edge of the first common electrode close to the first connection line on the first side is a first distance; a distance between a second wire portion of the first connection line on the second side and an edge of the first common electrode close to the first connection line on the second side is a second distance; a distance between a fifth wire portion of the second connection line on the first side and an edge of the second common electrode close to the second connection line on the first side is a third distance; and a distance between a fifth wire portion of the second connection line on the second side and an edge of the second common electrode close to the second connection line on the second side is a fourth distance.

For example, in the display module provided by at least one example, a product of a difference between the first distance and the second distance and a difference between the third distance and the fourth distance is a positive value.

For example, in the display module provided by at least one example, the display panel comprises a first conductive structure and a first shielding layer, and the first conductive structure is electrically connected to the first shielding layer; the light control panel comprises a second conductive structure and a second shielding layer, and the second conductive structure is electrically connected to the second shielding layer; the first shielding layer and the second shielding layer are stacked with each other, and at least part of the first shielding layer and at least part of the second shielding layer are in a display region of the display module; at least part of the first conductive structure and at least part of the second conductive structure are in a peripheral region of the display module; and a distance from a center of the display module to an edge, close to the center of the display module, of an orthographic projection of the first conductive structure on the first surface is greater than a distance from the center of the display module to an edge, close to the center of the display module, of an orthographic projection of the second conductive structure on the first surface.

For example, in the display module provided by at least one example, the display panel further comprises a first opposite substrate, a first liquid crystal layer, and a first array substrate; the light control panel further comprises a second opposite substrate, a second liquid crystal layer, and a second array substrate; the first shielding layer, the first opposite substrate, the first liquid crystal layer, the first array substrate, the second shielding layer, the second opposite substrate, the second liquid crystal layer, and the second array substrate are sequentially arranged in the direction perpendicular to the first surface; two ends of the first conductive structure are respectively in direct contact with the first array substrate and the first shielding layer; and two ends of the second conductive structure are respectively in direct contact with the second array substrate and the second shielding layer.

For example, in the display module provided by at least one example, the display panel comprises a third common electrode at least partially in a display region of the display module, and the third common electrode further serves as at least part of a touch electrode of the display module.

For example, in the display module provided by at least one example, the display module further comprises at least one first flexible circuit board. The third common electrode comprises a plurality of self-capacitance electrodes arranged in an array; the display panel further comprises a plurality of first touch wires; the at least one first flexible circuit board comprises a plurality of third wires; and first ends of the plurality of third wires are electrically connected to the plurality of self-capacitance electrodes arranged in an array through the plurality of first touch wires.

For example, in the display module provided by at least one example, the light control panel comprises a fourth common electrode at least partially in the display region of the display module; the fourth common electrode comprises a plurality of second strip-shaped electrodes arranged side by side in the first direction; the third common electrode comprises a plurality of first strip-shaped electrodes arranged side by side in a second direction crossing the first direction; and the plurality of first strip-shaped electrodes and the plurality of second strip-shaped electrodes, as a whole, serve as touch electrodes based on mutual capacitance.

For example, in the display module provided by at least one example, the display panel further comprises a first liquid crystal layer, and the light control panel further comprises a second liquid crystal layer; and the third common electrode and the fourth common electrode are between the first liquid crystal layer and the second liquid crystal layer.

For example, in the display module provided by at least one example, the display panel comprises a first array substrate and a first opposite substrate; the light control panel comprises a second array substrate and a second opposite substrate; and the third common electrode and the fourth common electrode are respectively in the first opposite substrate and the second opposite substrate, or the third common electrode and the fourth common electrode are respectively in the first array substrate and the second array substrate.

For example, in the display module provided by at least one example, the display panel further comprises a first liquid crystal layer, and the light control panel further comprises a second liquid crystal layer; and the third common electrode and the fourth common electrode are on both sides of the second liquid crystal layer in a direction in which the light control panel and the display panel are stacked.

For example, in the display module provided by at least one example, the display panel comprises a first array substrate; the light control panel comprises a second array substrate; the third common electrode and the fourth common electrode are respectively in the first array substrate and the second array substrate; and the first array substrate is between the first liquid crystal layer and the second liquid crystal layer.

For example, in the display module provided by at least one example, the display module further comprises: a plurality of first flexible circuit boards and a plurality of second flexible circuit boards. Each of the plurality of first flexible circuit boards comprises a plurality of third wires and a first chip; each of the plurality of second flexible circuit boards comprises a plurality of fourth wires and a second chip; the display panel further comprises a plurality of first touch wires, and the light control panel further comprises a plurality of second touch wires; first ends of the plurality of third wires are electrically connected to corresponding first strip-shaped electrodes through corresponding first touch wires; and first ends of the plurality of fourth wires are electrically connected to corresponding second strip-shaped common electrodes through corresponding second touch wires.

For example, in the display module provided by at least one example, a plurality of first chips are configured to apply touch driving signals to the plurality of first strip-shaped electrodes, and a plurality of second chips are configured to use signals obtained from the plurality of second strip-shaped electrodes as touch signals; or the plurality of second chips are configured to apply touch driving signals to the plurality of second strip-shaped electrodes, and the plurality of first chips are configured to use signals obtained from the plurality of first strip-shaped electrodes as touch signals.

For example, in the display module provided by at least one example, the plurality of second chips are configured to apply touch driving signals to the plurality of second strip-shaped electrodes; the plurality of first chips are configured to extract fluctuation values of signals obtained by the plurality of first strip-shaped electrodes; and the fluctuation values of the signals obtained by the plurality of first strip-shaped electrodes are used for brightness compensation of the display module.

For example, in the display module provided by at least one example, the display module further comprises a backlight unit. The backlight unit is on a side of the light control panel away from the display panel, and the at least one first circuit board and the at least one second circuit board are on a side of the backlight unit away from the display panel.

At least one embodiment of the present disclosure provides another display module, which comprises: a display panel, a light control panel, at least one first circuit board for the display panel, at least one second circuit board for the light control panel, at least one first flexible circuit board, and at least one second flexible circuit board. The display panel and the backlight unit are stacked; the display panel is on a light-emitting side of the light control panel; a first end of the at least one first flexible circuit board is bonded to the display panel, and a second end of the at least one first flexible circuit board is bonded to the at least one first circuit board; a first end of the at least one second flexible circuit board is bonded to the light control panel, and a second end of the at least one second flexible circuit board is bonded to the at least one second circuit board; a light-emitting surface of the display panel is on a first surface; and an orthographic projection of any one of the at least one first flexible circuit board on the first surface does not overlap with an orthographic projection of the at least one second flexible circuit board on the first surface in a direction perpendicular to the first surface.

For example, in the display module provided by at least one example, the display module further comprises a backlight unit. The backlight unit is on a side of the light control panel away from the display panel, and the at least one first circuit board and the at least one second circuit board are on a side of the backlight unit away from the display panel.

At least one embodiment of the present disclosure provides further another display module, which comprises: a display panel and a light control panel. The display panel and the backlight unit are stacked; the display panel is on a light-emitting side of the light control panel; the display panel comprises a third common electrode at least partially in a display region of the display module, and the third common electrode further serves as at least part of a touch electrode of the display module.

For example, in the display module provided by at least one example, the display module further comprises a backlight unit. The backlight unit is on a side of the light control panel away from the display panel, and the at least one first circuit board and the at least one second circuit board are on a side of the backlight unit away from the display panel.

For example, in the display module provided by at least one example, the display further comprises: at least one first flexible circuit board. The third common electrode comprises a plurality of self-capacitance electrodes arranged in an array; the display panel further comprises a plurality of first touch wires; the at least one first flexible circuit board comprises a plurality of third wires; and first ends of the plurality of third wires are electrically connected to the plurality of self-capacitance electrodes arranged in an array through the plurality of first touch wires.

For example, in the display module provided by at least one example, the light control panel comprises a fourth common electrode at least partially in the display region of the display module; the fourth common electrode comprises a plurality of second strip-shaped electrodes arranged side by side in the first direction; the third common electrode comprises a plurality of first strip-shaped electrodes arranged side by side in a second direction crossing the first direction; and the plurality of first strip-shaped electrodes and the plurality of second strip-shaped electrodes, as a whole, serve as touch electrodes based on mutual capacitance.

For example, in the display module provided by at least one example, the display panel further comprises a first liquid crystal layer, and the light control panel further comprises a second liquid crystal layer; and the third common electrode and the fourth common electrode are between the first liquid crystal layer and the second liquid crystal layer.

For example, in the display module provided by at least one example, the display panel comprises a first array substrate and a first opposite substrate; the light control panel comprises a second array substrate and a second opposite substrate; and the third common electrode and the fourth common electrode are respectively in the first opposite substrate and the second opposite substrate, or the third common electrode and the fourth common electrode are respectively in the first array substrate and the second array substrate.

For example, in the display module provided by at least one example, the display panel further comprises a first liquid crystal layer, and the light control panel further comprises a second liquid crystal layer; and the third common electrode and the fourth common electrode are on both sides of the second liquid crystal layer in a direction in which the light control panel and the display panel are stacked.

For example, in the display module provided by at least one example, the display panel comprises a first array substrate; the light control panel comprises a second array substrate; the third common electrode and the fourth common electrode are respectively in the first array substrate and the second array substrate; and the first array substrate is between the first liquid crystal layer and the second liquid crystal layer.

For example, in the display module provided by at least one example, the display module further comprises: a plurality of first flexible circuit boards and a plurality of second flexible circuit boards. Each of the plurality of first flexible circuit boards comprises a plurality of third wires and a first chip; each of the plurality of second flexible circuit boards comprises a plurality of fourth wires and a second chip; the display panel further comprises a plurality of first touch wires, and the light control panel further comprises a plurality of second touch wires; first ends of the plurality of third wires are electrically connected to corresponding first strip-shaped electrodes through corresponding first touch wires; and first ends of the plurality of fourth wires are electrically connected to corresponding second strip-shaped common electrodes through corresponding second touch wires.

For example, in the display module provided by at least one example, a plurality of first chips are configured to apply touch driving signals to the plurality of first strip-shaped electrodes, and a plurality of second chips are configured to use signals obtained from the plurality of second strip-shaped electrodes as touch signals; or the plurality of second chips are configured to apply touch driving signals to the plurality of second strip-shaped electrodes, and the plurality of first chips are configured to use signals obtained from the plurality of first strip-shaped electrodes as touch signals.

For example, in the display module provided by at least one example, the plurality of second chips are configured to apply touch driving signals to the plurality of second strip-shaped electrodes; the plurality of first chips are configured to extract fluctuation values of signals obtained by the plurality of first strip-shaped electrodes; and the fluctuation values of the signals obtained by the plurality of first strip-shaped electrodes are used for brightness compensation of the display module.

At least one embodiment of the present disclosure further provides a display device, which comprises any one of the display modules provided by at least one embodiment of the present disclosure.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The inventors of the present disclosure have noticed in research that the contrast of ordinary liquid crystal display devices is low. For example, ordinary liquid crystal display devices (for example, a liquid crystal display device based on advanced super dimension switch technology with a single liquid crystal cell) usually have a light leakage problem in the dark state, which will make the contrast of the display image of the liquid crystal display device lower. It should be noted that the low contrast of an ordinary liquid crystal display device may also be related to other factors, which will not be described here. The inventors of the present disclosure have noticed in research that a liquid crystal display device with dual liquid crystal cells can be used to improve the contrast of the display image. The following is an exemplary description with reference to FIG. 1A.

Figure 1A:
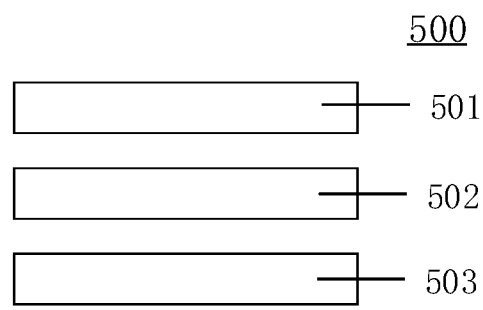
FIG. 1A shows a schematic cross-sectional view of a liquid crystal display device.
Figure 1B:
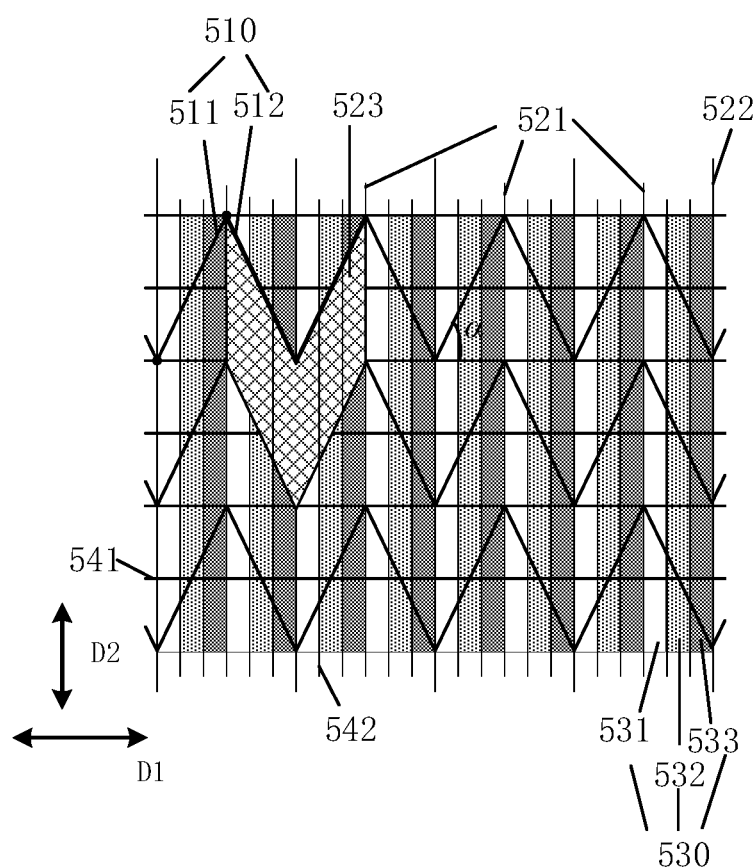
FIG. 1B shows a schematic planar view of a light control panel and a display panel of the liquid crystal display device illustrated in FIG. 1A.
Figure 1C:
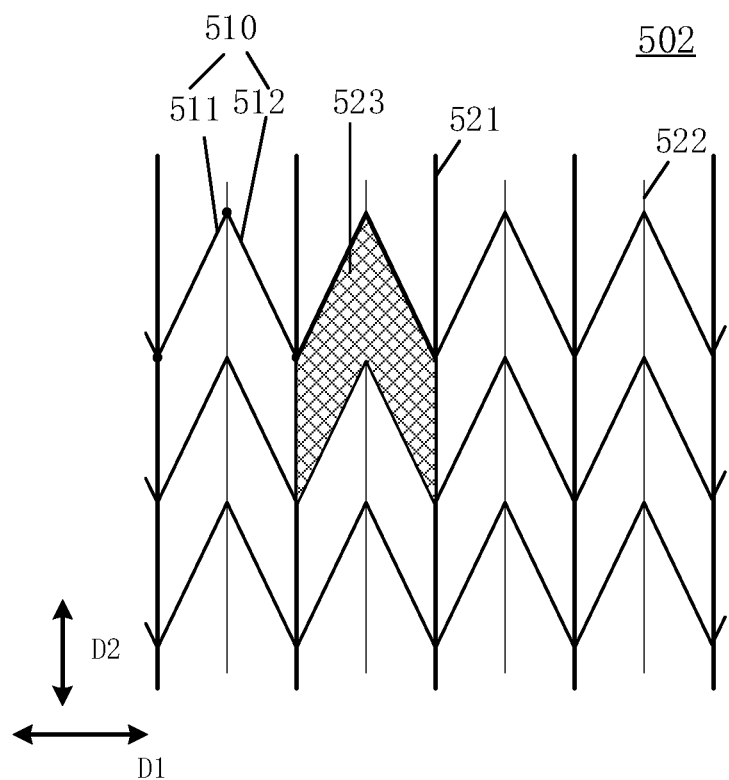
FIG. 1C shows a schematic planar view of a light control panel of the liquid crystal display device illustrated in FIG. 1A.

FIG. 1A shows a schematic cross-sectional view of a liquid crystal display device 500. As illustrated in FIG. 1A, the liquid crystal display device 500 includes a backlight unit 503, a light control panel 502, and a display panel 501 which are sequentially arranged. FIG. 1B shows a schematic planar view of the light control panel 502 and the display panel 501 of the liquid crystal display device 500 illustrated in FIG. 1A. FIG. 1C shows a schematic planar view of the light control panel 502 (an array substrate of the light control panel 502) of the liquid crystal display device 500 illustrated in FIG. 1A. For example, the light control panel 502 is configured to adjust the intensity of light emitted by the backlight unit 503 and emitted to the display panel 501. For example, the light emitted from the light control panel 502 is white light, that is, the light control panel 502 does not have a color adjustment function (for example, only gray-scale display is performed).

As illustrated in FIG. 1B, the display panel 501 includes a plurality of first signal lines 541 extending in a first direction D1 and a plurality of second signal lines 542 extending in a second direction D2. The plurality of first signal lines 541 and the plurality of second signal lines 542 intersect to define a plurality of display sub-pixel units arranged in an array, and the plurality of display sub-pixel units form a plurality of display pixel units 530 arranged in an array. Each display pixel unit 530 includes a first display sub-pixel unit 531, a second display sub-pixel unit 532, and a third display sub-pixel unit 533. For example, the first display sub-pixel unit 531, the second display sub-pixel unit 532, and the third display sub-pixel unit 533 are a red display sub-pixel unit, a green display sub-pixel unit, and a blue display sub-pixel unit, respectively. For example, the first direction D1 is perpendicular to the second direction D2. For example, the first signal line 541 is a gate line of the display panel 501, and the second signal line 542 is a data line of the display panel 501.

As illustrated in FIG. 1B and FIG. 1C, the light control panel 502 (the array substrate 551 of the light control panel 502) includes a plurality of gate lines 510 respectively extending in the first direction D1 and a plurality of data lines 521 respectively extending in the second direction D2 crossing the first direction D1. The plurality of gate lines 510 and the plurality of data lines 521 intersect to define a plurality of light control pixel units 523. For example, the light control panel 502 further includes a plurality of common electrode lines 522 extending in the second direction D2, respectively. For example, the light control panel 502 includes a plurality of light control units arranged in an array, and the plurality of light control pixel units 523 of the array substrate 551 are respectively arranged in the corresponding light control units.

For example, the light control panel 502 can adjust the transmittance of each light control unit of the light control panel based on the data signal received by the data line 521. Therefore, the light control unit of the light control panel 502 can be used to control the intensity of light emitted into the display sub-pixel unit of the display panel 501 corresponding to the light control unit, so that the light control panel 502 can be used to provide the display panel 501 with adjusted backlight. For example, by providing the light control panel 502 in the display device 500, the transmittance of the light control unit corresponding to the region where the brightness of the display image of the liquid crystal display device is low (for example, the brightness is zero) is low (for example, the transmittance is equal to or close to zero). In this case, the use of a liquid crystal display device with dual liquid crystal cells (that is, a display device with a light control panel) can improve the contrast of the display image.

For example, the width of the first signal line 541 is greater than the width of the gate line 510. For example, the first display sub-pixel unit 531, the second display sub-pixel unit 532, and the third display sub-pixel unit 533 have the same size in the first direction D1. For example, the first display sub-pixel unit 531, the second display sub-pixel unit, and the third display sub-pixel unit 533 have the same size in the second direction D2.

As illustrated in FIG. 1B and FIG. 1C, each gate line 510 of the light control panel 502 is implemented as a polygonal wire. Each gate line 510 includes a plurality of first wire portions 511 and a plurality of second wire portions 512, the plurality of first wire portions 511 and the plurality of second wire portions 512 are alternately arranged, and adjacent first wire portion 511 and second wire portion 512 are connected to each other. As illustrated in FIG. 1B, the angle α (an acute angle) between the first wire portion 511 (or/and the second wire portion 512) and the first direction D1 is about 50 degrees to 70 degrees, so as to reduce the moire pattern of the liquid crystal display device 500. For example, the first wire portion 511 and the second wire portion 512 are both straight wire portions (straight wires). In some examples, at least one of the gate lines 510 of the light control panel 502 may also be implemented as a straight wire.

Figure 1D:
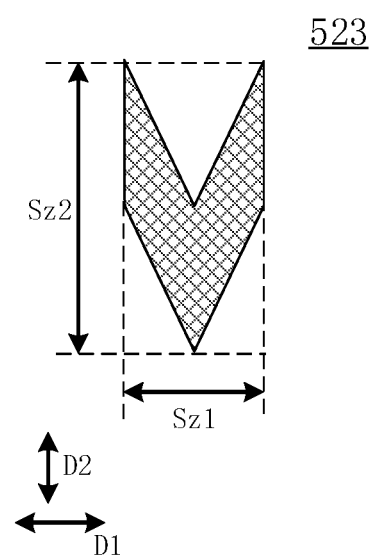
FIG. 1D shows a schematic planar view of a light control pixel unit of the light control panel illustrated in FIG. 1A.

FIG. 1D shows a schematic planar view of the light control pixel unit 523 of the light control panel 502 illustrated in FIG. 1A. As illustrated in FIG. 1D, the size of the light control pixel unit 523 in the first direction D1 is Sz1, and the size of the light control pixel unit 523 in the second direction D2 is Sz2. As illustrated in FIG. 1B to FIG. 1D, the size Sz1 of the light control pixel unit 523 in the first direction D1 is equal to twice the size of the display pixel unit 530 in the first direction D1, and the size Sz2 of the light control pixel unit 523 in the second direction D2 is equal to four times the size of the display pixel unit 530 in the second direction D2.

Figure 1E:
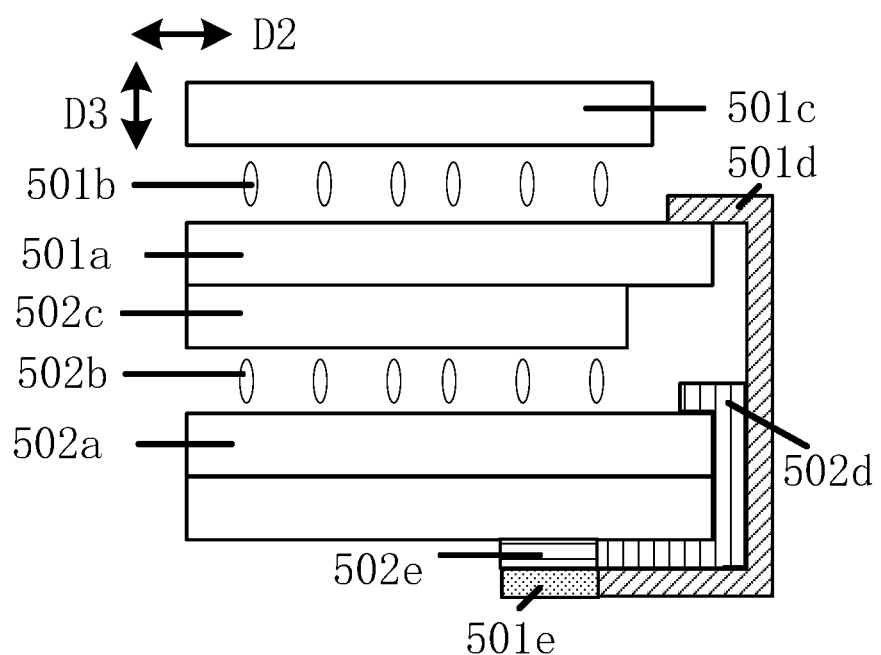
FIG. 1E shows another schematic cross-sectional view of the liquid crystal display device illustrated in FIG. 1A.

FIG. 1E shows another schematic cross-sectional view of the liquid crystal display device 500 illustrated in FIG. 1A. For example, as illustrated in FIG. 1E, the display panel 501 further includes a first array substrate 501a, a first liquid crystal layer 501b, and a first opposite substrate 501c; the light control panel 502 further includes a second array substrate 502a, a second liquid crystal layer 502b, and a second opposite substrate 502c; the liquid crystal display device 500 further includes a first flexible circuit board 501d, a first circuit board 501e for the display panel 501, a second flexible circuit board 502d, and a second circuit board 502e for the light control panel 502; the first end of the first flexible circuit board 501d is bonded to the first array substrate 501a of the display panel 501, and the second end of the first flexible circuit board 501d is bonded to the first circuit board 501e; and the first end of the second flexible circuit board 502d is bonded to the second array substrate 502a of the light control panel 502, and the second end of the second flexible circuit board 502d is bonded to the second circuit board 502e.

The inventors of the present disclosure have noticed in research that the first circuit board 501e for the display panel 501 and the second circuit board 502e for the light control panel 502 at least partially overlap in the stacking direction of the display panel 501 and the light control panel 502 (for example, in the third direction D3 perpendicular to the first direction D1 and the second direction D2), and the first flexible circuit board 501d and the second flexible circuit board 502d at least partially overlap in the stacking direction of the display panel 501 and the light control panel 502 (for example, in the third direction D3 perpendicular to the first direction D1 and the second direction D2). In this case, there may be mutual friction between the first circuit board 501e for the display panel 501 and the second circuit board 502e for the light control panel 502, or/and there may be mutual friction between the first flexible circuit board 501d and the second flexible circuit board 502d. In this case, it may cause poor display due to friction. For example, the above-mentioned poor display is due to abrasion or temperature increase (for example, the heat produced by friction is concentrated) of wiring (or components) of at least one of the first flexible circuit board 501d, the first circuit board 501e, the second flexible circuit board 502d, and the second circuit board 502e.

At least one embodiment of the present disclosure provides a display module and a display device. For example, the display module includes a display panel, a light control panel, at least one first circuit board for the display panel, and at least one second circuit board for the light control panel. The display panel and the light control panel are stacked; the display panel is located on a light-emitting side of the light control panel; a light-emitting surface of the display panel is located on a first surface; at least part of an orthographic projection of any one of the at least one first circuit board on the first surface does not overlap with an orthographic projection of the at least one second circuit board on the first surface in a direction perpendicular to the first surface.

For example, by allowing at least part of the at least one first circuit board used for the display panel not to overlap with the at least one second circuit board used for the light control panel in the direction perpendicular to the first surface, the possibility of friction between the at least one first circuit board used for the display panel and the at least one second circuit board used for the light control panel can be reduced, and further the possibility of poor display (for example, poor display caused by transportation) can be reduced.

For example, the orthographic projection of any one of the at least one first circuit board on the first surface and the orthographic projection of the at least one second circuit board on the first surface do not overlap in the direction perpendicular to the first surface.

Figure 5:
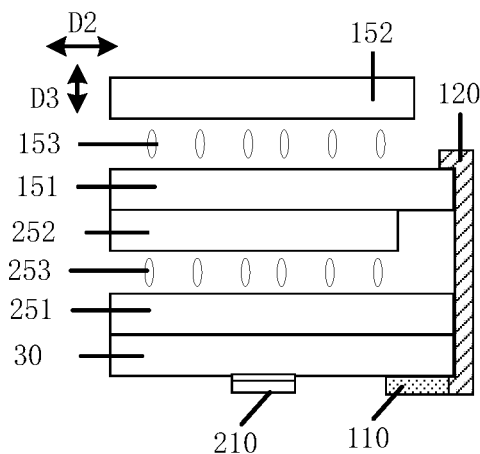
FIG. 5 is a cross-sectional view of the display module illustrated in FIG. 4 along a line B-B'.

It should be noted that although FIG. 5 or the like illustrates the light control panel 20 as a liquid crystal panel, the light control panel 20 of at least one embodiment of the present disclosure is not limited to being implemented as a liquid crystal panel. In some examples, the light control panel 20 may also be implemented as a self-luminous panel. In this case, at least one embodiment of the present disclosure provides a display module that may not include a backlight unit. For example, the self-luminous panel may be implemented as an inorganic light-emitting panel or an organic light-emitting panel. For example, the inorganic light-emitting panel may include a plurality of inorganic light-emitting diodes, and the plurality of inorganic light-emitting diodes are arranged in an array, for example. For example, the inorganic light-emitting diode may be implemented as a mini light-emitting diode (mini LED), a micro light-emitting diode (micro LED), or other suitable light-emitting diodes.

The following is a non-limiting description of the display module and the display device provided by the embodiments of the present disclosure through several examples or embodiments. As described below, in case of no conflict, different features in these specific examples or embodiments can be combined with each other, so as to obtain new examples or embodiments, and these new examples or embodiments also fall within the protection scope of the present disclosure.

Figure 2:
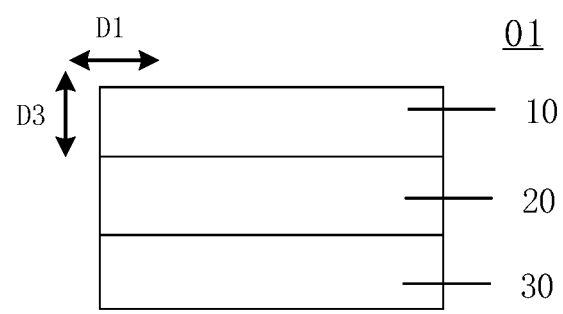
FIG. 2 is a schematic diagram of a display module provided by at least one embodiment of the present disclosure.
Figure 3:
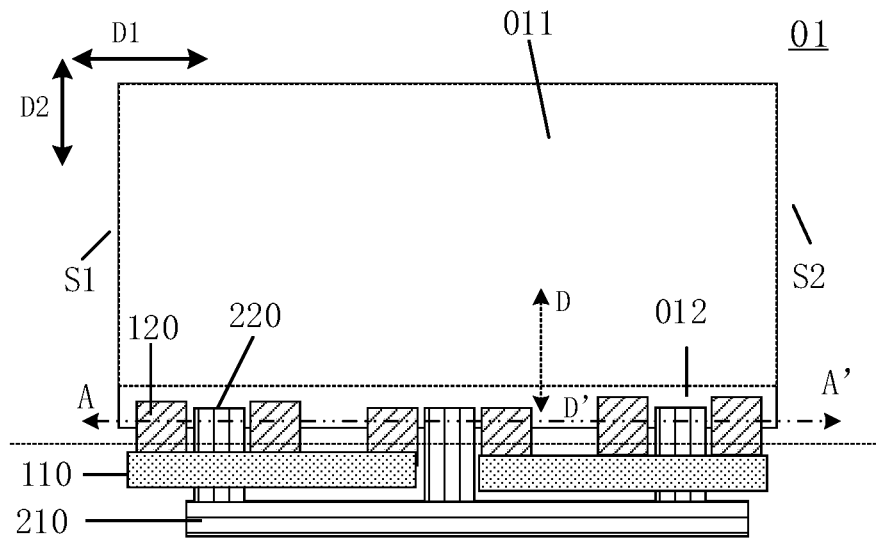
FIG. 3 is a schematic planar diagram of a display module provided by at least one embodiment of the present disclosure.
Figure 4:
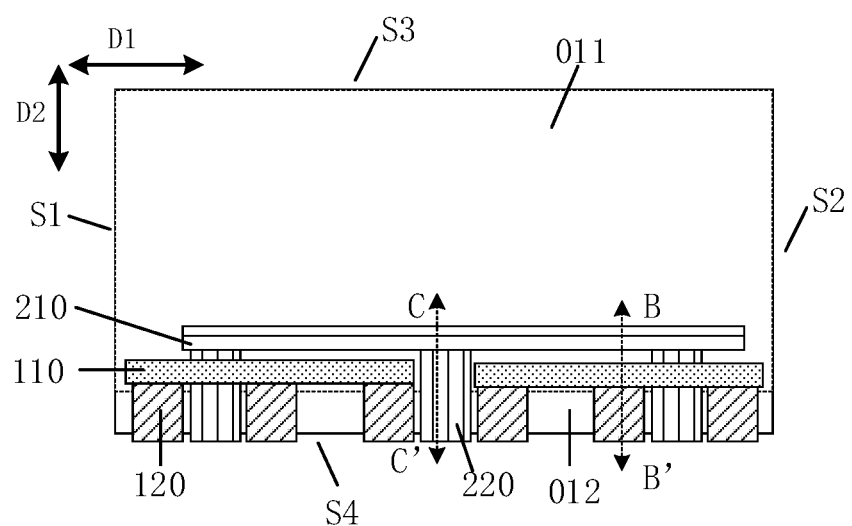
FIG. 4 is a back view of the display module illustrated in FIG. 3.

FIG. 2 is a schematic diagram of a display module 01 provided by at least one embodiment of the present disclosure, FIG. 3 is a schematic planar diagram (a front view) of the display module 01 provided by at least one embodiment of the present disclosure, and FIG. 4 is a back view of the display module 01 illustrated in FIG. 3.

As illustrated in FIG. 2 to FIG. 4, the display module 01 includes a display panel 10, a backlight unit 30, a light control panel 20, at least one first circuit board 110 for the display panel 10, and at least one second circuit board 210 for the light control panel 20.

As illustrated in FIG. 2, the display panel 10, the light control panel 20, and the backlight unit 30 are stacked (for example, stacked in the third direction D3); the display panel 10 is located on a light-emitting side of the light control panel 20; and the backlight unit 30 is located on a side of the light control panel 20 away from the display panel 10.

As illustrated in FIG. 3 and FIG. 4, the light-emitting surface of the display panel 10 (that is, the surface of the display panel 10 away from the backlight unit 30) is located on the first surface, and at least part of the orthographic projection of any one of the at least one first circuit board 110 on the first surface does not overlap with the orthographic projection of the at least one second circuit board 210 (for example, all the second circuit boards 210) on the first surface in the direction perpendicular to the first surface.

For example, the orthographic projection of any one of the at least one first circuit board 110 on the first surface and the orthographic projection of the at least one second circuit board 210 (for example, all the second circuit boards 210) on the first surface do not overlap in the direction perpendicular to the first surface.

For example, the at least one first circuit board 110 and the at least one second circuit board 210 are located on a side of the light control panel 20 away from the display panel 10. For example, the at least one first circuit board 110 and the at least one second circuit board 210 are located on a side of the backlight unit 30 away from the display panel 10.

For example, by allowing the orthographic projection of any one of the at least one first circuit board 110 on the first surface not to overlap with the orthographic projection of the at least one second circuit board 210 on the first surface in the direction perpendicular to the first surface, the possibility of friction between the at least one first circuit board 110 used for the display panel 10 and the at least one second circuit board 210 used for the light control panel 20 can be reduced, and further the possibility of poor display due to friction can be reduced.

It should be noted that although the display panel 10 and the light control panel 20 illustrated in FIG. 3 are in direct contact, and the light control panel 20 and the backlight unit 30 are in direct contact, at least one embodiment of the present disclosure is not limited thereto. For example, the display panel 10 and the light control panel 20 are arranged at an interval in the third direction D3, and/or the light control panel 20 and the backlight unit 30 are arranged at an interval in the third direction D3.

It should be noted that although the front view of the display module 01 illustrated in FIG. 3 also shows the first circuit board 110 and the second circuit board 210, in the actual product of the display device including the display module 01, at least one first circuit board 110 for the display panel 10 and at least one second circuit board 210 for the light control panel 20 are located on the side of the backlight unit 30 away from the light control panel 20. Those skilled in the art should understand that, in the actual product of the display device including the display module 01, the components (or parts of the components) below the dotted line illustrated in FIG. 3 are all located on the side of the backlight unit 30 away from the light control panel 20. In this case, the front view of the display module 01 illustrated in FIG. 3 may be the same as or similar to the front view of the display module 01 illustrated in FIG. 24.

For example, the first circuit board 110 and the second circuit board 210 are both printed circuit boards. In the first example, the first circuit board 110 and the second circuit board 210 are respectively electrically connected to a first timing controller printed circuit board (not shown in the figure) and a second timing controller printed circuit board (not shown in the figure), so as to receive driving signals from the first timing controller printed circuit board and the second timing controller printed circuit board, respectively, and to provide driving signals to the first flexible circuit board 120 and the second flexible circuit board 220, respectively. In the second example, the first circuit board 110 and the second circuit board 210 are respectively connected to the first timing controller printed circuit board and the second timing controller printed circuit board, so as to provide driving signals to the first flexible circuit board 120 and the second flexible circuit board 220, respectively.

For example, the display device including the display module 01 includes the first timing controller printed circuit board and the second timing controller printed circuit board. For example, at least one (for example, all) of the first timing controller printed circuit board and the second timing controller printed circuit board includes a timing controller. For example, at least one (for example, all) of the first timing controller printed circuit board and the second timing controller printed circuit board may further include at least one of a gamma circuit, a power management integrated circuit, and a common electrode voltage circuit. For example, the above-mentioned driving signal includes a digital operating voltage (DVDD). For example, the above-mentioned driving signal may also include a gate-on voltage and a gate-off voltage.

For example, as illustrated in FIG. 3 and FIG. 4, at least one first circuit board 110 and at least one second circuit board 210 respectively extend in the first direction D1. The orthographic projection of the at least one first circuit board 110 on the first surface at least partially overlaps with the orthographic projection of the at least one second circuit board 210 on the first surface in the second direction D2 crossing the first direction D1. For example, the first direction D1, the second direction D2, and the third direction D3 cross each other (for example, perpendicular to each other).

For example, "the orthographic projection of the at least one first circuit board 110 on the first surface at least partially overlaps with the orthographic projection of the at least one second circuit board 210 on the first surface in the second direction D2" means that in view of the second direction D2 (for example, from the upper side to the lower side of FIG. 4), regarding the orthographic projection of the at least one first circuit board 110 on the first surface and the orthographic projection of the at least one second circuit board 210 on the first surface, the orthographic projection of the second circuit board 210 on the first surface at least partially shields the orthographic projection of the corresponding first circuit board 110 on the first surface. For example, "at least partially overlapping in the first direction" described in at least one embodiment of the present disclosure has the same or similar meaning, and details will not be repeated.

For example, as illustrated in FIG. 3 and FIG. 4, the orthographic projection of the at least one first circuit board 110 on the first surface and the orthographic projection of the at least one second circuit board 210 on the first surface are spaced apart in the second direction D2, so that the orthographic projection of any one of the at least one first circuit board 110 on the first surface does not overlap with the orthographic projection of the at least one second circuit board 210 on the first surface in the direction perpendicular to the first surface.

Figure 6:
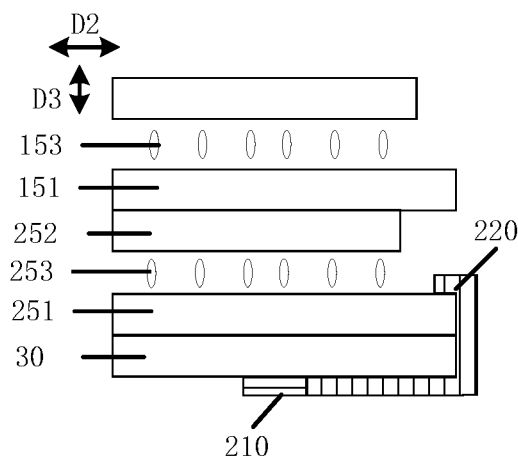
FIG. 6 is a cross-sectional view of the display module illustrated in FIG. 4 along a line C-C'.

FIG. 5 is a cross-sectional view of the display module 01 illustrated in FIG. 4 along a line B-B', and FIG. 6 is a cross-sectional view of the display module 01 illustrated in FIG. 4 along a line C-C'.

For example, as illustrated in FIG. 5, the display panel 10 further includes a first array substrate 151, a first liquid crystal layer 153, and a first opposite substrate 152, and the light control panel 20 includes a second array substrate 251, a second liquid crystal layer 253, and a second opposite substrate 252. For example, as illustrated in FIG. 5, the backlight unit 30, the second array substrate 251, the second liquid crystal layer 253, the second opposite substrate 252, the first array substrate 151, the first liquid crystal layer 153, and the first opposite substrate 152 are sequentially arranged in the third direction D3.

For example, as illustrated in FIG. 3 to FIG. 5, the display module 01 further includes at least one first flexible circuit board 120 and at least one second flexible circuit board 220. The first end of the at least one first flexible circuit board 120 is bonded to the display panel 10 (the first array substrate 151 of the display panel 10), and the second end of the at least one first flexible circuit board 120 is bonded to the at least one first circuit board 110, so that the display panel 10 is operatively connected to the at least one first circuit board 110. The first end of the at least one second flexible circuit board 220 is bonded to the light control panel 20 (the second array substrate 251 of the light control panel 20), and the second end of the at least one second flexible circuit board 220 is bonded to the at least one second circuit board 210, so that the light control panel 20 is operatively connected to the at least one second circuit board 210.

For example, as illustrated in FIG. 4, the display module 01 includes a first side S1 and a second side S2 opposite to each other in the first direction D1, and includes a third side S3 and a fourth side S4 opposite to each other in the second direction D2. For example, as illustrated in FIG. 3, the bonding position of the at least one first flexible circuit board 120 with the display panel 10 and the bonding position of the at least one second flexible circuit board 220 with the light control panel 20 are located on the same side (for example, the fourth side S4) of the display module 01.

For example, as illustrated in FIG. 4, in the actual product of the display device including the display module 01, the at least one first flexible circuit board 120 and the at least one second flexible circuit board 220 are bent, so that the at least one first circuit board 110 used for the display panel 10 and the at least one second circuit board 210 used for the light control panel 20 are located on the side of the backlight unit 30 away from the light control panel 20. For example, as illustrated in FIG. 4, in the actual product of the display device including the display module 01, part of each of the at least one first flexible circuit board 120 and at least one second flexible circuit board 220 is also located on the side of the backlight unit 30 away from the light control panel 20. For example, as illustrated in FIG. 4, the at least one first circuit board 110 and the at least one second circuit board 210 at least partially overlap with the display region 011 of the display module 01.

For example, as illustrated in FIG. 3, the length (for example, the physical length) of the at least one first flexible circuit board 120 is smaller than the length (for example, the physical length) of the at least one second flexible circuit board 220. For example, as illustrated in FIG. 3, the difference between the length of the at least one second flexible circuit board 220 and the length of the at least one first flexible circuit board 120 is greater than or equal to the width of the at least one first circuit board 110 in the second direction D2. In this case, before the at least one first flexible circuit board 120 and the at least one second flexible circuit board 220 are bent, the orthographic projection of any one of the at least one first circuit board 110 on the first surface does not overlap with the orthographic projection of the at least one second circuit board 210 on the first surface in the direction perpendicular to the first surface, so that the possibility of friction between the at least one first circuit board 110 used for the display panel 10 and the at least one second circuit board 210 used for the light control panel 20 can be reduced, and further the possibility of poor display due to friction can be reduced.

It should be noted that although in the display module 01 illustrated in FIG. 3, the difference between the length of the at least one second flexible circuit board 220 and the length of the at least one first flexible circuit board 120 is greater than or equal to the width of the at least one first circuit board 110 in the second direction D2, at least one embodiment of the present disclosure is not limited thereto. For example, the difference between the length of the at least one second flexible circuit board 220 and the length of the at least one first flexible circuit board 120 may also be smaller than the width of the at least one first circuit board 110 in the second direction D2, or even the length (for example, the physical length) of the at least one first flexible circuit board 120 is greater than the length (for example, the physical length) of the at least one second flexible circuit board 220, as long as in the final product, the orthographic projection of any one of the at least one first circuit board 110 on the first surface does not overlap with the orthographic projection of the at least one second circuit board 210 on the first surface in the direction perpendicular to the first surface (for example, the orthographic projection of the at least one first circuit board 110 on the first surface and the orthographic projection of the at least one second circuit board 210 on the first surface are arranged at an interval in the second direction D2).

For example, as illustrated in FIG. 4, the length (for example, the length in the second direction D2) of the portion of the at least one second flexible circuit board 220 located on the side of the backlight unit 30 away from the light control panel 20 is greater than or equal to the length (for example, the length in the second direction D2) of the portion of the at least one first flexible circuit board 120 located on the side of the backlight unit 30 away from the light control panel 20. In this case, the orthographic projection of any one of the at least one first circuit board 110 on the first surface does not overlap with the orthographic projection of the at least one second circuit board 210 on the first surface in the direction perpendicular to the first surface.

For example, the display panel 10 and the light control panel 20 included in the display module 01 illustrated in FIG. 3 may adopt the display panel 10 and the light control panel 20 illustrated in FIG. 1B, but at least one embodiment of the present disclosure is not limited thereto. For example, the light control panel 20 included in the display module 01 illustrated in FIG. 3 may adopt a light control panel 20 similar to the light control panel 20 illustrated in FIG. 1B. For example, in the light control panel 20 similar to the light control panel 20 illustrated in FIG. 1B, the data line of the light control panel 20 is a bent line.

For example, the display panel 10 includes a plurality of display sub-pixel units 171 arranged in an array (referring to FIG. 12 below), and the light control panel 20 includes a plurality of light control pixel units 271 arranged in an array (referring to FIG. 13 below). The display sub-pixel units 171 form a plurality of display pixel units arranged in an array. For example, each of the plurality of display pixel units includes three display sub-pixel units 171. For example, the above-mentioned display sub-pixel units 171 are a red display sub-pixel unit, a green display sub-pixel unit, and a blue display sub-pixel unit, respectively.

For example, the size S1 of the light control pixel unit 271 in the first direction D1 is equal to twice the size of the display pixel unit in the first direction D1, and the size S2 of the light control pixel unit 271 in the second direction D2 is equal to four times the size of the display pixel unit in the second direction D2. For example, the resolution of the display panel 10 is equal to twice the resolution of the light control panel 20. In this case, the number of the at least one second flexible circuit board 220 may be equal to twice the number of the at least one first flexible circuit board 120. For example, the resolution of the display panel 10 and the resolution of the light control panel 20 are respectively equal to 8K and 4K. For another example, the resolution of the display panel 10 and the resolution of the light control panel 20 are respectively equal to 4K and 2K.

Figure 7:
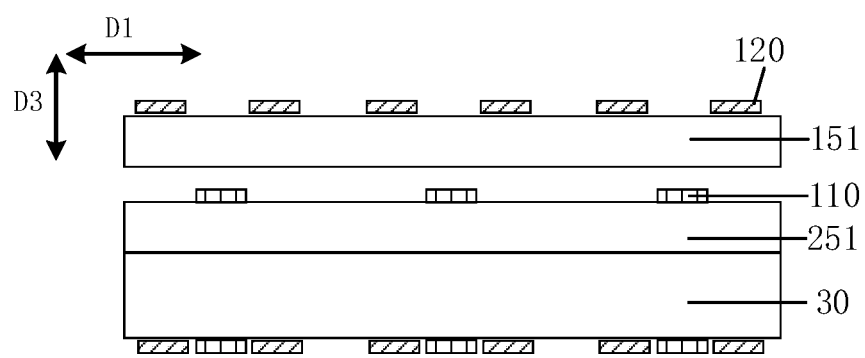
FIG. 7 is a cross-sectional view of the display module illustrated in FIG. 3 along a line A-A'.

FIG. 7 is a cross-sectional view of the display module 01 illustrated in FIG. 3 along a line A-A'. For example, as illustrated in FIG. 3 and FIG. 7, the orthographic projection of any one of the at least one first flexible circuit board 120 on the first surface and the orthographic projection of the at least one second flexible circuit board 220 (for example, all the second flexible circuit boards 220) on the first surface are arranged at an interval in the first direction D1.

For example, by allowing the orthographic projection of any one of the at least one first flexible circuit board 120 on the first surface to be spaced apart from the orthographic projection of the at least one second flexible circuit board 220 on the first surface in the first direction D1, the possibility of friction between the at least one first flexible circuit board 120 and the at least one second flexible circuit board 220 can be reduced, and further the possibility of poor display due to friction can be reduced.

For example, as illustrated in FIG. 3 and FIG. 7, the at least one first flexible circuit board 120 includes a plurality of first flexible circuit boards 120 arranged side by side in the first direction D1, and the at least one second flexible circuit board 220 includes a plurality of second flexible circuit boards 220 are arranged side by side in the first direction D1.

For example, the display panel 10 includes a plurality of first signal lines 131, and the light control panel 20 includes a plurality of second signal lines 231. For example, each of the first signal lines 131 and second signal lines 231 as a whole extends in the second direction D2. It should be noted that each of the first signal lines 131 and second signal lines 231 as a whole extending in the second direction D2 only limits the extending direction of the plurality of first signal lines 131 and the plurality of second signal lines 231, which does not mean that the wire included in each of the first signal lines 131 and second signal lines 231 is parallel to the second direction D2 at all positions. For example, each of the plurality of first signal lines 131 is parallel to the second direction D2, and each of the plurality of second signal lines 231 includes a bent line.

For example, the total number of wires electrically connected to the first signal lines 131 included in the plurality of first flexible circuit boards 120 is equal to the number of the first signal lines 131, and the total number of wires electrically connected to the second signal lines 231 included in the plurality of second flexible circuit boards 220 is equal to the number of the second signal lines 231.

For example, the number of the plurality of first signal lines 131 is greater than the number of the plurality of second signal lines 231. Correspondingly, the number of the plurality of first flexible circuit boards 120 is greater than or equal to the number of the plurality of second flexible circuit boards 220, and/or the number of wires electrically connected to the first signal lines 131 included in each of the plurality of first flexible circuit boards 120 is greater than the number of wires electrically connected to the second signal lines 231 included in each of the plurality of second flexible circuit boards 220.

For example, in the case where the display panel and the light control panel illustrated in FIG. 1B are adopted, the number of the first signal lines 131 is substantially equal to six times the number of the second signal lines 231. Correspondingly, the total number of wires electrically connected to the first signal lines 131 included in the plurality of first flexible circuit boards 120 is substantially equal to six times the total number of wires electrically connected to the second signal lines 231 included in the plurality of second flexible circuit boards 220.

For example, the wire included in the first flexible circuit board 120 is not limited to the wire electrically connected to the first signal line 131, and the wire included in the first flexible circuit board 120 may also include the following third wire or other applicable wires. For example, the wire included in the second flexible circuit board 220 is not limited to the wire electrically connected to the second signal line 231, and the wire included in the second flexible circuit board 220 may also include the following fourth wire or other applicable wires.

For example, as illustrated in FIG. 3 and FIG. 7, at least two first flexible circuit boards 120 are provided between two adjacent second flexible circuit boards 220 in the first direction D1.

It should be noted that, for clarity, in the display module 01 illustrated in FIG. 3 and FIG. 7, the number of the first flexible circuit boards 120 and the number of the second flexible circuit boards 220 are equal to 6 and 3, respectively. However, at least one embodiment of the present disclosure is not limited thereto. For example, the number of the first flexible circuit boards 120 and the number of the second flexible circuit boards 220 can be set according to the size of the display module 01. For example, for a 65-inch display module 01, the resolution of the display panel 10 and the resolution of the light control panel 20 may be equal to 4K and 2K, respectively, and the number of the first flexible circuit boards 120 and the number of the second flexible circuit boards 220 may be equal to 12 and 6, respectively. For example, for an 86-inch display module 01, the resolution of the display panel 10 and the resolution of the light control panel 20 may be equal to 4K and 2K, respectively, and the number of the first flexible circuit boards 120 and the number of the second flexible circuit boards 220 may be equal to 48 (24 on one side, being bonded on both sides) and 24 (12 on one side, being bonded on both sides), respectively.

In some examples (for example, the display module 01 only has a display function, but does not have a touch function), as illustrated in FIG. 3 and FIG. 7, the number of the plurality of first flexible circuit boards 120 is equal to twice the number of the plurality of second flexible circuit boards 220, but at least one embodiment of the present disclosure is not limited thereto. For example, in the case where the display module 01 also has a touch function, the number of the plurality of first flexible circuit boards 120 may be equal to twice, four times, six times the number of the plurality of second flexible circuit boards 220, or other applicable numbers.

For example, as illustrated in FIG. 3 and FIG. 4, the number (for example, three) of the first flexible circuit boards 120 bonded to each of the at least one first circuit board 110 is equal to the number of the second flexible circuit boards 220 bonded to each of the at least one second circuit board 210. In this case, the number of the at least one first circuit board 110 is greater than the number of the at least one second circuit board 210, and the length of each of the at least one first circuit board 110 in the first direction D1 is smaller than the length of each of the at least one second circuit board 210 in the first direction D1.

For example, as illustrated in FIG. 3 and FIG. 4, the at least one first circuit board 110 includes a plurality of first circuit boards 110 arranged side by side in the first direction D1, and the at least one second circuit board 210 includes a plurality of second circuit boards 210 arranged side by side in the first direction D1. For example, as illustrated in FIG. 3 and FIG. 4, the number of the plurality of first circuit boards 110 is equal to twice the number of the plurality of second circuit boards 210.

For example, as illustrated in FIG. 3 and FIG. 4, the number (for example, three) of the first flexible circuit boards 120 bonded to each of the plurality of first circuit boards 110 is equal to the number of the second flexible circuit boards 220 bonded to each of the plurality of second circuit boards 210.

For example, as illustrated in FIG. 3 and FIG. 4, in the first direction D1, at least one of the plurality of second flexible circuit boards 220 is disposed between two adjacent first circuit boards 110, thereby avoiding the friction between the first circuit board 110 and at least one of the above-mentioned second flexible circuit boards 220, so that the possibility of poor display (for example, poor display caused by the transportation process) due to friction can be further reduced. It should be noted that the two adjacent first circuit boards 110 mean that no other first circuit board 110 is provided between the two adjacent first circuit boards 110, but other components (for example, the second flexible circuit board 220) may be provided between the two adjacent first circuit boards 110.

Figure 8:
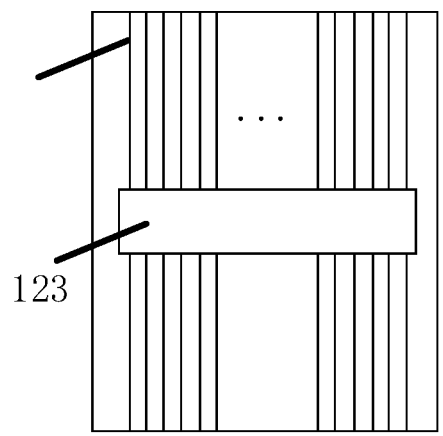
FIG. 8 is a schematic diagram of a first flexible circuit board of the display module illustrated in FIG. 3.
Figure 9:
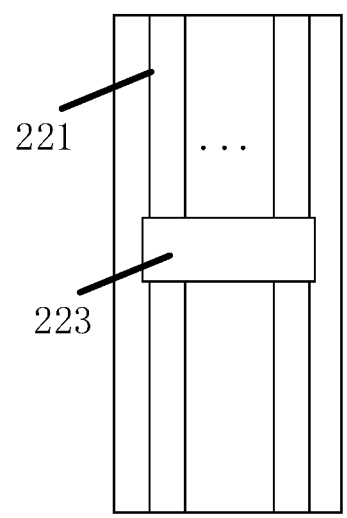
FIG. 9 is a schematic diagram of a second flexible circuit board of the display module illustrated in FIG. 3.

FIG. 8 is a schematic diagram (a schematic planar view) of the first flexible circuit board 120 of the display module 01 illustrated in FIG. 3, and FIG. 9 is a schematic diagram (a schematic planar view) of the second flexible circuit board 220 of the display module 01 illustrated in FIG. 3.

For example, as illustrated in FIG. 8 and FIG. 9, each of the plurality of first flexible circuit boards 120 includes a plurality of first wires 121, and each of the plurality of second flexible circuit boards 220 includes a plurality of second wires 221. The number of the plurality of first wires 121 included in each of the plurality of first flexible circuit boards 120 is greater than or equal to the number of the plurality of second wires 221 included in each of the plurality of second flexible circuit boards 220.

For example, each of the plurality of first flexible circuit boards 120 includes a plurality of first pins, and each of the plurality of second flexible circuit boards 220 includes a plurality of second pins. For example, the number of the plurality of first pins may be equal to the number of the plurality of second pins. In this case, some of the second pins in the second flexible circuit board 220 are not electrically connected to the wire included in the second flexible circuit board 220. Correspondingly, in practical applications, some of the second pins mentioned above are not used (for example, suspended or grounded).

For example, in the case where the width of the flexible circuit board in the first direction D1 is equal to 48 mm, the flexible circuit board has 960 pins. For example, in the case where the width of the flexible circuit board in the first direction D1 is equal to 70 mm, the flexible circuit board has 1680 pins.

For example, each first signal line 131 is electrically connected to the display sub-pixel units 171 located in the same column, and each second signal line 231 is electrically connected to the light control pixel units 271 located in the same column. For example, the number of the plurality of first wires 121 is substantially equal to (for example, equal to) three times the number of the plurality of second wires

221. For example, regarding the aforementioned 65-inch display module 01, the number of the plurality of first wires 121 included in each of the plurality of first flexible circuit boards 120 is 960, and the number of the plurality of second wires 221 included in each of the plurality of second flexible circuit boards 220 is 320. For example, regarding the aforementioned 86-inch display module 01, the number of the plurality of first wires 121 included in each of the plurality of first flexible circuit boards 120 is 1440, and the number of the plurality of second wires 221 included in each of the plurality of second flexible circuit boards 220 is 480.

For example, as illustrated in FIG. 8 to FIG. 11, the width of each of the plurality of first flexible circuit boards 120 in the first direction D1 is greater than the width of each of the plurality of second flexible circuit boards 220 in the first direction D1. For example, the width of each of the plurality of first flexible circuit boards 120 in the first direction D1 is smaller than three times the width of each of the plurality of second flexible circuit boards 220 in the first direction D1 (for example, smaller than twice the width of each of the plurality of second flexible circuit boards 220 in the first direction D1). For example, the width of each of the plurality of first flexible circuit boards 120 in the first direction D1 and the width of each of the plurality of second flexible circuit boards 220 in the first direction D1 are equal to 60 mm to 80 mm (for example, 70 mm) and 45 mm to 52 mm (for example, 48 mm), respectively.

In some examples, the widths of at least some (for example, all) of the first flexible circuit boards 120 in the first direction D1 may be equal to the width of each of the second flexible circuit boards 220 in the first direction D1.

Figure 10:
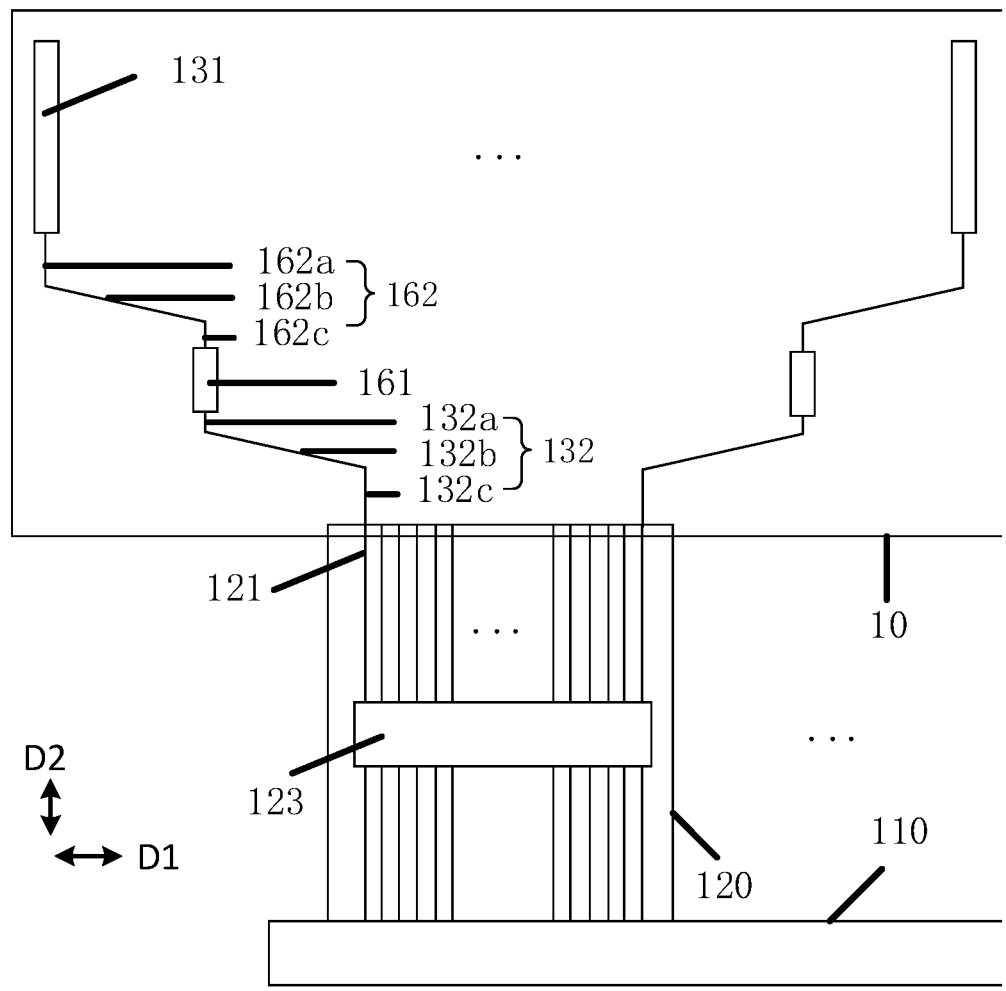
FIG. 10 is a schematic diagram of electrical connection of a display panel and the first flexible circuit board of the display module illustrated in FIG. 3.
Figure 11:
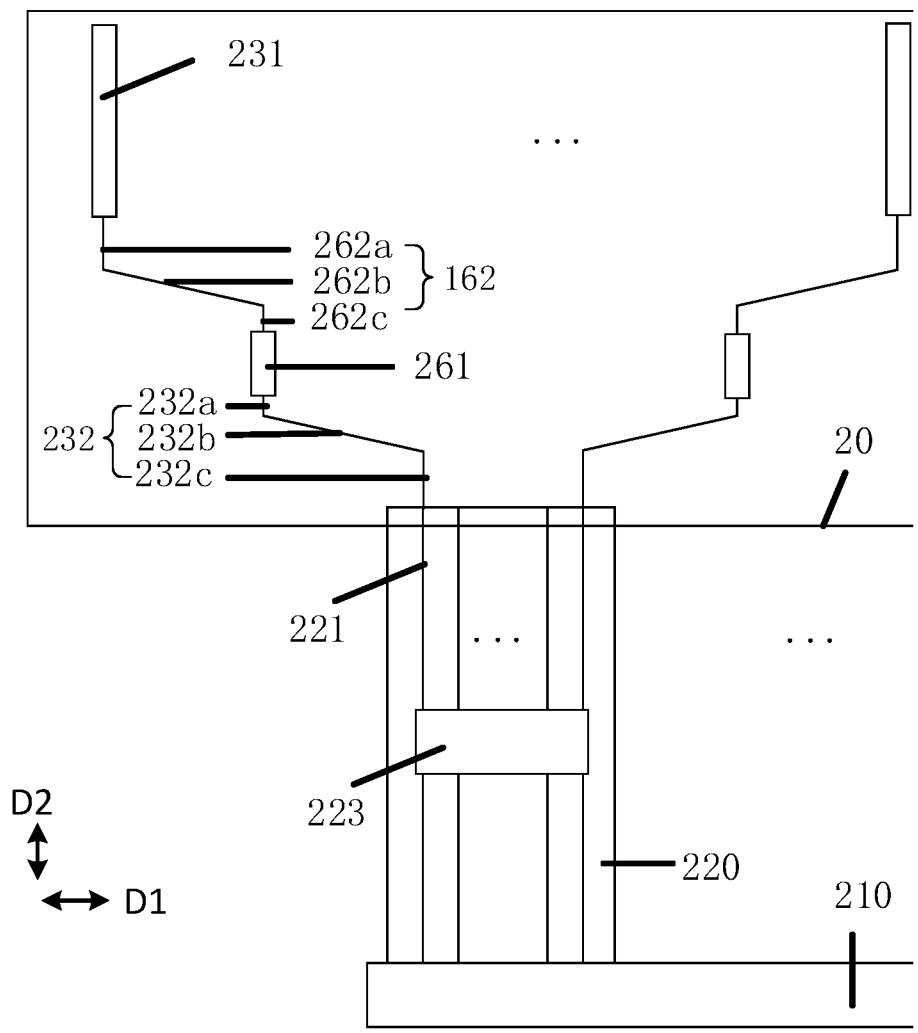
FIG. 11 is a schematic diagram of electrical connection of a light control panel and the second flexible circuit board of the display module illustrated in FIG. 3.
Figure 12:
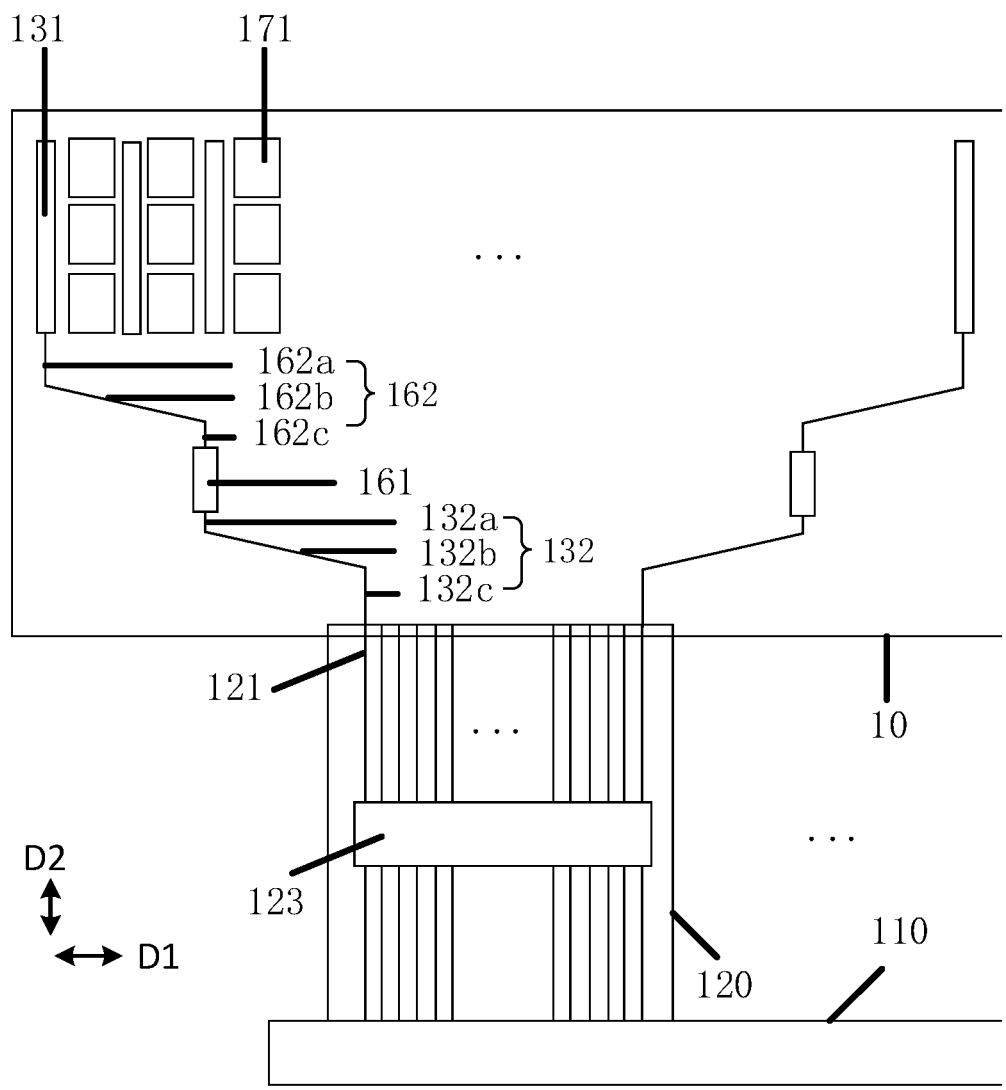
FIG. 12 is a schematic diagram of a partial region of the display panel of the display module illustrated in FIG. 3.
Figure 13:
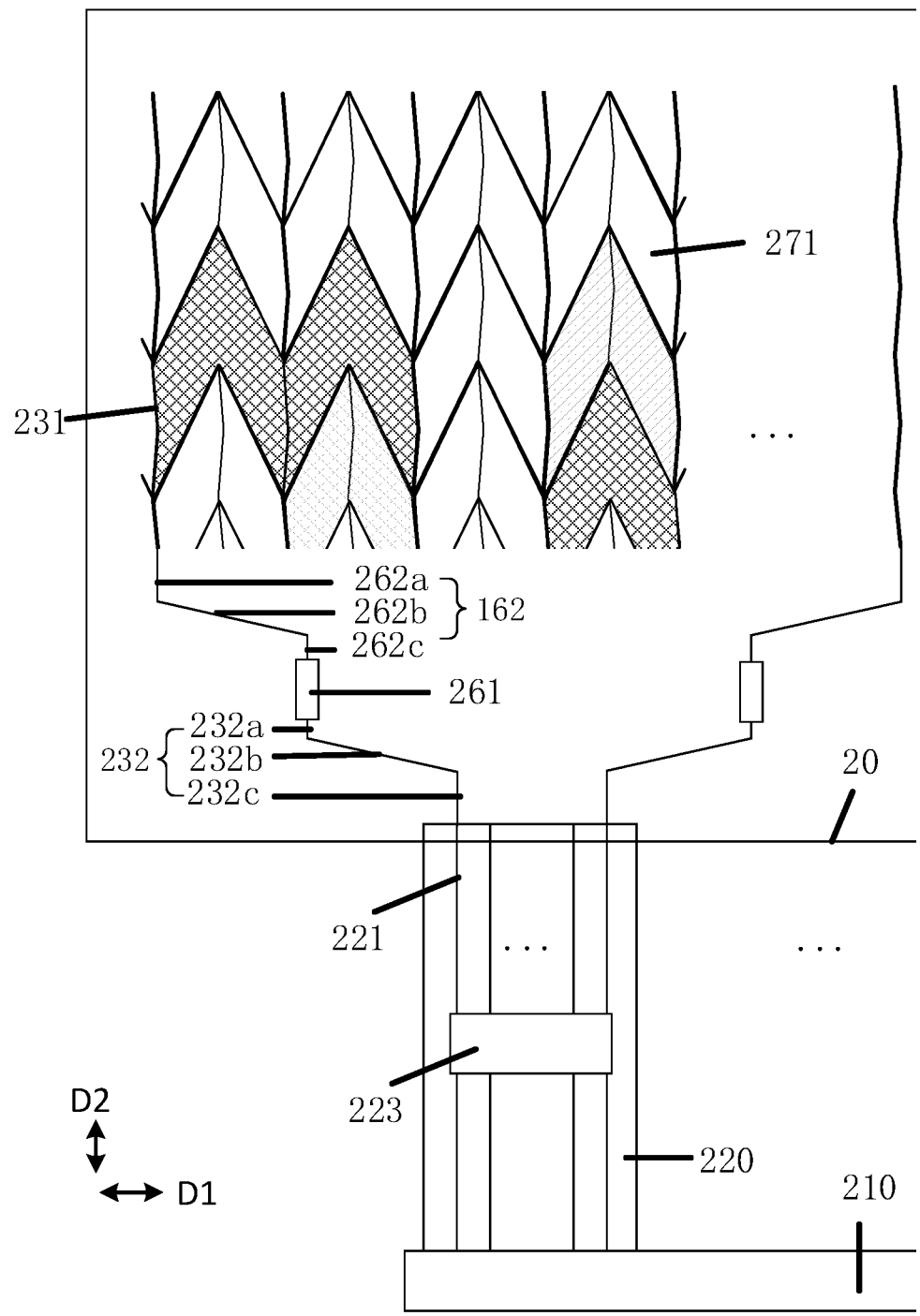
FIG. 13 is a schematic diagram of a partial region of the light control panel of the display module illustrated in FIG. 3.

FIG. 10 is a schematic diagram of electrical connection of the display panel 10 and the first flexible circuit board 120 of the display module 01 illustrated in FIG. 3, FIG. 11 is a schematic diagram of electrical connection of the light control panel 20 and the second flexible circuit board 220 of the display module 01 illustrated in FIG. 3, FIG. 12 is a schematic diagram of a partial region of the display panel 10 of the display module 01 illustrated in FIG. 3, and FIG. 13 is a schematic diagram of a partial region of the light control panel 20 of the display module 01 illustrated in FIG. 3.

For example, as illustrated in FIG. 10, the first ends of the plurality of first wires 121 included in each of the plurality of first flexible circuit boards 120 are respectively electrically connected to the first number of first signal lines 131 (for example, the data lines of the display panel 10) included in the display panel 10. For example, as illustrated in FIG. 10 and FIG. 12, the display panel 10 further includes a plurality of first connection lines 132, a plurality of first antistatic circuits 161, and a plurality of third connection lines 162. The first ends of the plurality of first wires 121 included in each of the plurality of first flexible circuit boards 120 are respectively electrically connected to the first number of first signal lines 131 (for example, the data lines of the display panel 10) included in the display panel 10 through the corresponding first connection line 132, the first antistatic circuit 161, and the third connection line 162, and the second ends of the plurality of first wires 121 included in each of the plurality of first flexible circuit boards 120 are electrically connected to the corresponding first circuit board 110.

For example, as illustrated in FIG. 8 and FIG. 10, each of the plurality of first flexible circuit boards 120 further includes a first chip 123. For example, the first chip 123 may be a display driver chip or a touch and display driver integration (TDDI). For example, the above-mentioned display driver chip may include a data driver. For example, the first chip 123 is configured to receive the first driving signal from the first circuit board 110 through the first wire 121, and the first chip 123 is further configured to generate a first data signal based on the first driving signal. The first data signal is transmitted to the first signal line 131 sequentially through the first connection line 132, the first antistatic circuit 161, and the third connection line 162.

For example, each of the plurality of first wires 121 included in each of the plurality of first flexible circuit boards 120 may include two first sub-wires arranged side by side in the second direction D2; two ends of the first sub-wire at least partially located between the first connection line 132 and the first chip 123 are electrically connected to the first connection line 132 and the data signal output terminal of the first chip 123, respectively; and two ends of the first sub-wire at least partially located between the first circuit board 110 and the first chip 123 are electrically connected to the first circuit board 110 and the driving signal input terminal of the first chip 123, respectively.

For example, as illustrated in FIG. 11, the first ends of the plurality of second wires 221 included in each of the plurality of second flexible circuit boards 220 are respectively electrically connected to the second number of second signal lines 231 (for example, the data lines of the light control panel 20) included in the light control panel 20. For example, as illustrated in FIG. 11 and FIG. 13, the light control panel 20 further includes a plurality of second connection lines 232, a plurality of second antistatic circuits 261, and a plurality of fourth connection lines 262. The first ends of the plurality of second wires 221 included in each of the plurality of second flexible circuit boards 220 are respectively electrically connected to the second number of second signal lines 231 included in the light control panel 20 through the corresponding second connection line 232, the second antistatic circuit 261, and the fourth connection line 262, and the second ends of the plurality of second wires 221 included in each of the plurality of second flexible circuit boards 220 are electrically connected to the corresponding second circuit board 210.

For example, as illustrated in FIG. 9 and FIG. 11, each of the plurality of second flexible circuit boards 220 includes a second chip 223. For example, the second chip 223 may be a display driver chip or a touch and display driver integration (TDDI). For example, the above-mentioned display driver chip may include a data driver. For example, the second chip 223 is configured to receive a second driving signal from the second circuit board 210 through the second wire 221, and the second chip 223 is further configured to generate a second data signal based on the second driving signal. The second data signal is transmitted to the second signal line 231 sequentially through the second connection line 232, the second antistatic circuit 261, and the fourth connection line 262.

For example, each of the plurality of second wires 221 included in each of the plurality of second flexible circuit boards 220 may include two second sub-wires arranged side by side in the second direction D2; two ends of the second sub-wire at least partially located between the second connection line 232 and the second chip 223 are electrically connected to the second connection line 232 and the data signal output terminal of the second chip 223, respectively; and two ends of the second sub-wire at least partially located between the second circuit board 210 and the second chip 223 are electrically connected to the second circuit board 210 and the driving signal input terminal of the second chip 223, respectively.

It should be noted that, for clarity, the second signal line 231 of the light control panel 20 illustrated in FIG. 11 is a straight line, but at least one embodiment of the present disclosure is not limited thereto. For example, as illustrated in FIG. 13, the second signal line 231 of the light control panel 20 may be a bent line.

It should be noted that the schematic diagram of the display panel 10 illustrated in FIG. 12 is used to show the connection relationship of the first connection line 132, the first antistatic circuit 161, the third connection line 162, the first signal line 131, and the display sub-pixel unit 171, and the schematic diagram of the light control panel 20 illustrated in FIG. 13 is used to show the connection relationship of the second connection line 232, the second antistatic circuit 261, the fourth connection line 262, the second signal line 231, and the light control pixel unit 271. Those skilled in the art should understand that FIG. 12 and FIG. 13 are not drawn to scale, and the specific shape of each element may be set according to actual application requirements.

Figure 14:
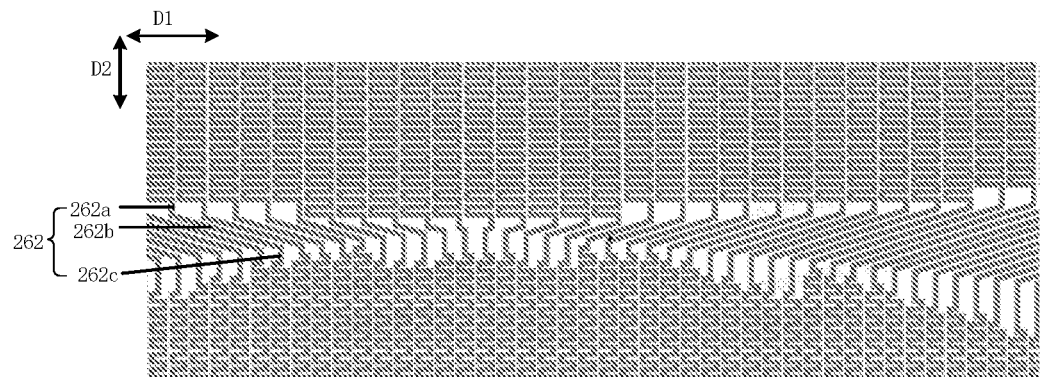
FIG. 14 is a partial schematic diagram of a plurality of first connection lines of the display panel of the display module illustrated in FIG. 3.
Figure 15:
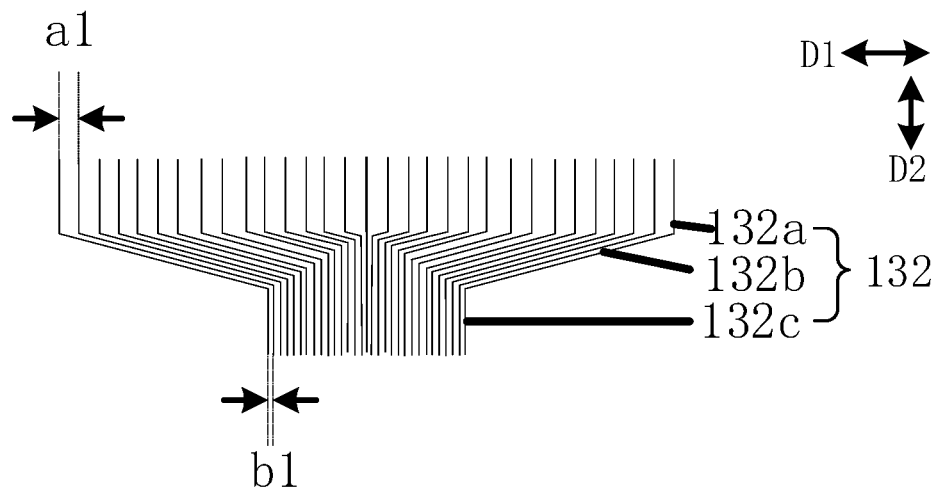
FIG. 15 is another partial schematic diagram of the plurality of first connection lines of the display panel of the display module illustrated in FIG. 3.
Figure 16:
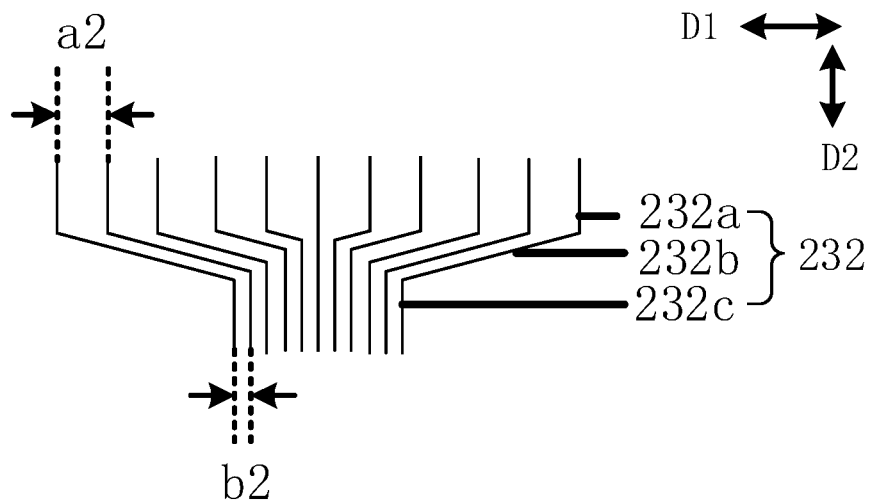
FIG. 16 is a partial schematic diagram of a plurality of second connection lines of the light control panel of the display module illustrated in FIG. 3.

FIG. 14 is a partial schematic diagram of a plurality of first connection lines 132 of the display panel 10 of the display module 01 illustrated in FIG. 3, FIG. 15 is another partial schematic diagram of the plurality of first connection lines 132 of the display panel 10 of the display module 01 illustrated in FIG. 3, and FIG. 16 is a partial schematic diagram of a plurality of second connection lines 232 of the light control panel 20 of the display module 01 illustrated in FIG. 3.

For example, as illustrated in FIG. 14 and FIG. 15, the display panel 10 includes a plurality of first connection lines 132, and each of the plurality of first connection lines 132 includes a first wire portion 132a, a second wire portion 132b, and a third wire portion 132c which are sequentially connected. As illustrated in FIG. 10, the first wire portion 132a is electrically connected to the corresponding first signal line 131 (electrically connected to the corresponding first signal line 131 through the corresponding first antistatic circuit and the corresponding third connection line), and the third wire portion 132c is electrically connected to the first flexible circuit board 120.

For example, as illustrated in FIG. 13 and FIG. 16, the light control panel 20 includes a plurality of second connection lines 232, and each of the plurality of second connection lines 232 includes a fourth wire portion 232a, a fifth wire portion 232b, and a sixth wire portion 232c which are sequentially connected. As illustrated in FIG. 11, the fourth wire portion 232a is electrically connected to the corresponding second signal line 231 (electrically connected to the corresponding second signal line 231 through the corresponding second antistatic circuit and the corresponding fourth connection line), and the sixth wire portion 232c is electrically connected to the second flexible circuit board 220.

For example, each of the first wire portion 132a, the third wire portion 132c, the fourth wire portion 232a, and the sixth wire portion 232c as a whole extends in the second direction D2, and each of the second wire portion 132b and the fifth wire portion 232b as a whole extends in a direction crossing the first direction D1 and the second direction D2.

It should be noted that the wire portion extending in a certain direction as a whole is not limited to the wire portion being parallel to that direction. For example, as illustrated in FIG. 14, the first wire portion 132a, the third wire portion 132c, the fourth wire portion 232a, and the sixth wire portion 232c may be serpentine wires extending in the second direction D2.

For example, as illustrated in FIG. 12 to FIG. 16, the lengths of the second wire portions 132b of the plurality of first connection lines 132 in the first direction D1 change at a first change rate, the lengths of the fifth wire portions 232b of the plurality of second connection lines 232 in the first direction D1 change at a second change rate, and the first change rate is smaller than the second change rate. For example, the first change rate refers to the difference between the lengths of two adjacent second wire portions 132b in the first direction D1, and the second change rate refers to the difference between the lengths of two adjacent fifth wire portions 232b in the first direction D1.

In some examples, the above-mentioned first change rate and second change rate are both fixed values. In other examples, at least one value of the first change rate and the second change rate is not a fixed value. In still other examples, the first change rate (or second change rate) is a fixed value within a specified range, but in different ranges, the value of the first change rate (or second change rate) is different. For example, the change rate of lengths of the second wire portions 132b in the first range of the plurality of first connection lines (for example, the first to tenth first connection lines from left to right among the plurality of first connection lines) in the first direction D1 is not equal to the change rate of lengths of the second wire portions 132b in the second range of the plurality of first connection lines (for example, the eleventh to twentieth first connection lines from left to right among the plurality of first connection lines) in the first direction D1, but the change rate of lengths of the second wire portions 132b in the first range of the plurality of first connection lines in the first direction D1 and the change rate of lengths of the second wire portions 132b in the second range of the plurality of first connection lines in the first direction D1 are both smaller than the second change rate.

For example, the lengths of the second wire portions of at least part of the plurality of first connection lines in the first direction change at a first change rate, the lengths of the fifth wire portions of at least part of the plurality of second connection lines in the first direction change at a second change rate, and the first change rate is smaller than the second change rate.

For example, as illustrated in FIG. 15, the distance between adjacent first wire portions 132a is equal to a1, and the distance between adjacent third wire portions 132c is equal to b1. The length L1(N) of the N-th second wire portion 132b, located on the left or right side of the middle second wire portion 132b in the first direction D1, in the first direction D1 satisfies the following expression: $L1(N)=e1\times(a1-b1)N$. For example, e1 may be a natural number within 0.1~10. For example, e1 may be equal to 1.

For example, as illustrated in FIG. 16, the distance between adjacent fourth wire portions 232a is equal to a2, and the distance between adjacent sixth wire portions 232c is equal to b2. The length L2(M) of the M-th fifth wire portion 232b, located on the left or right side of the middle fifth wire portion 232b in the first direction D1, in the first direction D1 satisfies the following expression: $L2(M)=e2\times(a2-b2)M$. For example, e2 may be a natural number within 0.1~10. For example, e2 may be equal to 1.

For example, the above-mentioned M is a positive integer smaller than or equal to M1, the above-mentioned N is a positive integer smaller than or equal to N1, and M1 is smaller than N1.

For example, the distance between adjacent first wire portions 132a is equal to a1, the distance between adjacent fourth wire portions 232a is equal to a2, and a1 is smaller than a2. The distance between adjacent third wire portions 132c is equal to b1, the distance between adjacent sixth wire portions 232c is equal to b2, and b1 is equal to b2. In this case, the first change rate is smaller than the second change rate. It should be noted that the distance b1 between adjacent third wire portions 132c is not limited to be equal to the distance b2 between adjacent sixth wire portions 232c. In some examples, the distance b1 between adjacent third wire portions 132c may be slightly smaller than the distance b2 between adjacent sixth wire portions 232c. In this case, the first change rate may also be smaller than the second change rate.

It should be noted that the first wire portion 132a, the second wire portion 132b, the third wire portion 132c, the fourth wire portion 232a, the fifth wire portion 232b, and the sixth wire portion 232c are not limited to the straight line segments illustrated in FIG. 15 and FIG. 16. In some examples, as illustrated in FIG. 14, at least part of the plurality of first wire portions 132a, at least part of the plurality of third wire portions 132c, at least part of the plurality of fourth wire portions 232a, and at least part of the plurality of sixth wire portions 232c may also be snake routing, so that the resistances of the plurality of first connection wires 132 are substantially the same, and the resistances of the plurality of second connection wires 232 are substantially the same. In some examples, as illustrated in FIG. 14, the second wire portion 132b and the fifth wire portion 232b may also have a bent structure.

Figure 17:
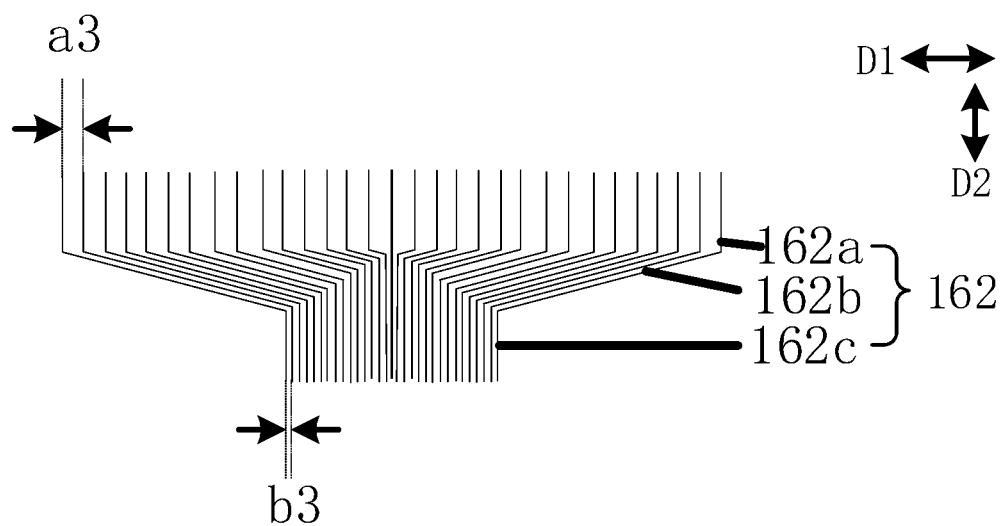
FIG. 17 is a partial schematic diagram of a plurality of third connection lines of the display panel provided by at least one embodiment of the present disclosure.
Figure 18:
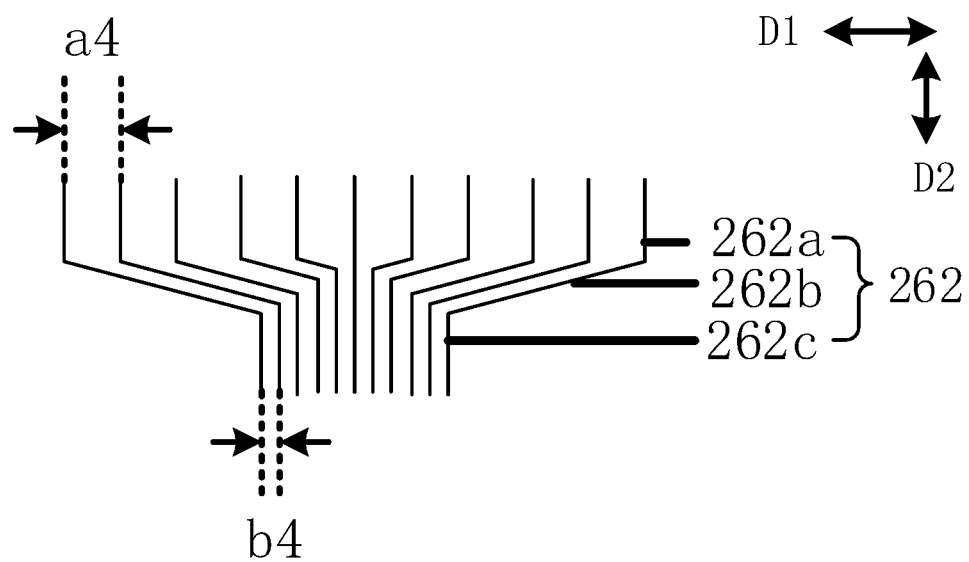
FIG. 18 is a partial schematic diagram of a plurality of fourth connection lines of the light control panel provided by at least one embodiment of the present disclosure.

FIG. 17 is a partial schematic diagram of a plurality of third connection lines 162 of the display panel 10 provided by at least one embodiment of the present disclosure, and FIG. 18 is a partial schematic diagram of a plurality of fourth connection lines 262 of the light control panel 20 provided by at least one embodiment of the present disclosure.

For example, as illustrated in FIG. 10 to FIG. 13 and FIG. 17 to FIG. 18, the display panel 10 includes a plurality of third connection lines 162, each of the plurality of third connection lines 162 includes a first conductive line 162a, a second conductive line 162b, and a third conductive line 162c which are connected in sequence, the first conductive line 162a is electrically connected (for example, directly connected) to the corresponding first signal line 131, and the third conductive line 162c is electrically connected (for example, directly connected) to the corresponding first antistatic circuit 161.

For example, as illustrated in FIG. 10 to FIG. 13 and FIG. 17 to FIG. 18, the light control panel 20 includes a plurality of second connection lines 232, and each of the plurality of second connection lines 232 includes a fourth conductive line 261b, a fifth conductive line 262b, and a sixth conductive line 262c which are connected in sequence. As illustrated in FIG. 11, the fourth conductive line 261b is electrically connected (for example, directly connected) to the corresponding second signal line 231, and the sixth conductive line 262c is electrically connected (for example, directly connected) to the corresponding second antistatic circuit 261.

For example, each of the first conductive line 162a, the third conductive line 162c, the fourth conductive line 261b, and the sixth conductive line 262c extends in the second direction D2 as a whole, and each of the second conductive line 162b and the fifth conductive line 262b extends in a direction crossing the first direction D1 and the second direction D2 as a whole.

For example, as illustrated in FIG. 10 to FIG. 13 and FIG. 17 to FIG. 18, the lengths of the second conductive lines 162b of the plurality of third connection lines 162 in the first direction D1 change at a third change rate, the lengths of the fifth conductive lines 262b of the plurality of second connection lines 232 in the first direction D1 change at a fourth change rate, and the third change rate is smaller than the fourth change rate. For example, the above-mentioned third change rate and fourth change rate are both fixed values. For example, the third change rate refers to the difference between the lengths of two adjacent second conductive lines 162b in the first direction D1, and the fourth change rate refers to the difference between lengths of two adjacent fifth conductive lines 262b in the first direction D1.

For example, as illustrated in FIG. 17, the distance between adjacent first conductive lines 162a is equal to a3, and the distance between adjacent third conductive lines 162c is equal to b3. The length L3(N) of the N-th second conductive line 162b, located on the left or right side of the middle second conductive line 162b in the first direction D1, in the first direction D1 satisfies the following expression: $L3(N)=e3\times(a3-b3)N$. For example, e3 may be a natural number within 0.1~10. For example, e3 may be equal to 1.

For example, as illustrated in FIG. 18, the distance between adjacent fourth conductive lines 261b is equal to a4, and the distance between adjacent sixth conductive lines 262c is equal to b4. The length L4(M) of the M-th fifth conductive line 262b, located on the left or right side of the middle fifth conductive line 262b in the first direction D1, in the first direction D1 satisfies the following expression: $L4(M)=e4\times(a4-b4)M$. For example, e4 may be a natural number within 0.1~10. For example, e4 may be equal to 1.

For example, the distance between adjacent first conductive lines 162a is equal to a3, the distance between adjacent fourth conductive lines 261b is equal to a4, and a3 is smaller than a4. The distance between adjacent third conductive lines 162c is equal to b3, the distance between adjacent sixth conductive lines 262c is equal to b4, and b3 is equal to b4. In this case, the third change rate is smaller than the fourth change rate. It should be noted that the distance b3 between adjacent third conductive lines 162c is not limited to be equal to the distance b4 between adjacent sixth conductive lines 262c. In some examples, the distance b3 between adjacent third conductive lines 162c may be slightly smaller than the distance b4 between adjacent sixth conductive lines 262c. In this case, the third change rate may also be smaller than the fourth change rate.

It should be noted that the first conductive line 162a, the second conductive line 162b, the third conductive line 162c, the fourth conductive line 261b, the fifth conductive line 262b, and the sixth conductive line 262c are not limited to the straight line segments illustrated in FIG. 17 and FIG. 18. In some examples, at least part of the plurality of first conductive lines 162a, at least part of the plurality of third conductive lines 162c, at least part of the plurality of fourth conductive lines 261b, and at least part of the plurality of sixth conductive lines 262c may also be snake routing, so that the resistances of the plurality of third connection lines 162 are substantially the same, and the resistances of the plurality of fourth connection lines 262 are substantially the same. In some examples, the second conductive line 162b and the fifth conductive line 262b may also have a bent structure.

Figure 19:
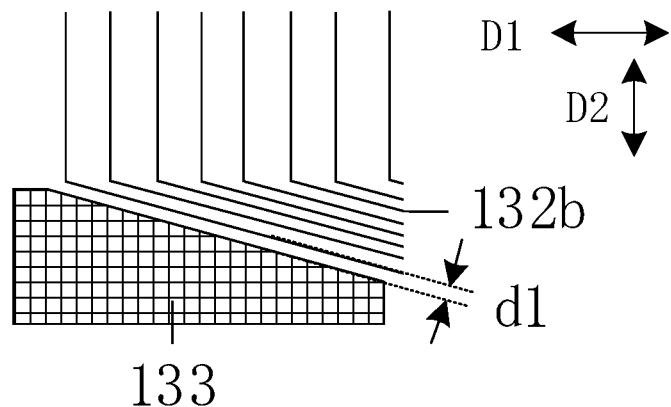
FIG. 19 is a schematic diagram of a first partial region of the display panel of the display module illustrated in FIG. 3.
Figure 20:
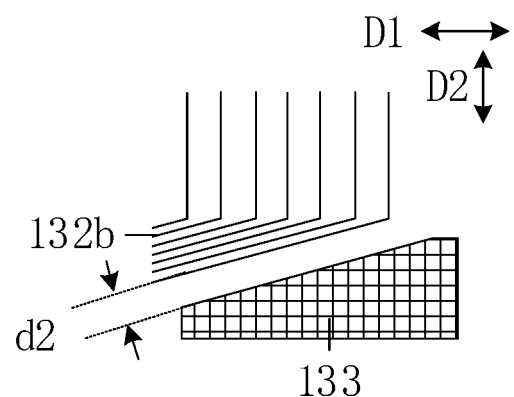
FIG. 20 is a schematic diagram of a second partial region of the display panel of the display module illustrated in FIG. 3.
Figure 21:
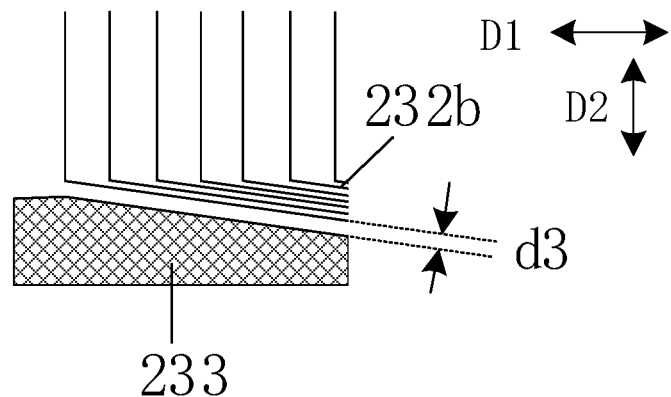
FIG. 21 is a schematic diagram of a third partial region of the light control panel of the display module illustrated in FIG. 3.
Figure 22:
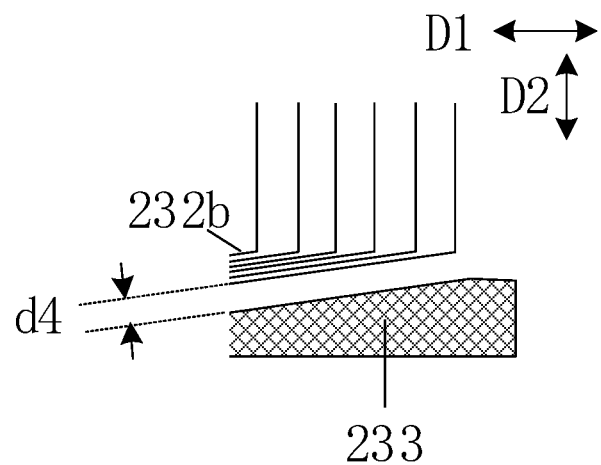
FIG. 22 is a schematic diagram of a fourth partial region of the light control panel of the display module illustrated in FIG. 3.

FIG. 19 is a schematic diagram of a first partial region (a region located on a first side S1 of a peripheral region 012 of FIG. 3) of the display panel 10 of the display module 01 illustrated in FIG. 3, FIG. 20 is a schematic diagram of a second partial region (a region located on a second side S2 of the peripheral region 012 of FIG. 3) of the display panel 10 of the display module 01 illustrated in FIG. 3, FIG. 21 is a schematic diagram of a third partial region (a region located on the first side S1 of the peripheral region 012 of FIG. 3) of the light control panel 20 of the display module 01 illustrated in FIG. 3, and FIG. 22 is a schematic diagram of a fourth partial region (a region located on the second side S2 of the peripheral region 012 of FIG. 3) of the light control panel 20 of the display module 01 illustrated in FIG. 3.

For example, as illustrated in FIG. 3 to FIG. 4 and FIG. 19 to FIG. 22, the display panel 10 further includes a first common electrode 133 located in the peripheral region 012 of the display module 01, and the light control panel 20 further includes a second common electrode 233 located in the peripheral region 012 of the display module 01. The two outermost first connection lines 132 among the plurality of first connection lines 132 include a first connection line 132 on the first side S1 and a first connection line 132 on the second side S2, and the two outermost second connection lines 232 among the plurality of second connection lines 232 include a second connection line 232 on the first side S1 and a second connection line 232 on the second side S2.

For example, as illustrated in FIG. 19 and FIG. 20, the extending direction of the second wire portion 132b of the first connection line 132 on the first side S1 is substantially the same as the extending direction of the edge, close to the first connection line 132 on the first side S1, of the first common electrode 133, and the distance between the second wire portion 132b of the first connection line 132 on the first side S1 and the edge of the first common electrode 133 close to the first connection line 132 on the first side S1 is a first distance d1 (referring to FIG. 19). The extending direction of the second wire portion 132b of the first connection line 132 on the second side S2 is substantially the same as the extending direction of the edge, close to the first connection line 132 on the second side S2, of the first common electrode 133, and the distance between the second wire portion 132b of the first connection line 132 on the second side S2 and the edge of the first common electrode 133 close to the first connection line 132 on the second side S2 is a second distance d2 (referring to FIG. 20).

For example, as illustrated in FIG. 21 and FIG. 22, the extending direction of the fifth wire portion 232b of the second connection line 232 on the first side S1 is substantially the same as the extending direction of the edge, close to the second connection line 232 on the first side S1, of the second common electrode 233, and the distance between the fifth wire portion 232b of the second connection line 232 on the first side S1 and the edge of the second common electrode 233 close to the second connection line 232 on the first side S1 is a third distance d3 (referring to FIG. 21). The extending direction of the fifth wire portion 232b of the second connection line 232 on the second side S2 is substantially the same as the extending direction of the edge, close to the second connection line 232 on the second side S2, of the second common electrode 233, and the distance between the fifth wire portion 232b of the second connection line 232 on the second side S2 and the edge of the second common electrode 233 close to the second connection line 232 on the second side S2 is a fourth distance d4 (referring to FIG. 22).

For example, the center line (not shown in the figure) of the first flexible circuit board 120 in the first direction D1 is aligned with the first signal line 131, and the center line (not shown in the figure) of the first common electrode 133 in the first direction D1 is aligned with the display sub-pixel unit 171. In this case, the first distance d1 is not equal to the second distance d2. For example, the center line (not shown in the figure) of the second flexible circuit board 220 in the first direction D1 is aligned with the second signal line 231, and the center line (not shown in the figure) of the second common electrode 233 in the first direction D1 is aligned with the light control pixel unit 271. In this case, the third distance d3 is not equal to the fourth distance d4.

For example, the product of the difference between the first distance d1 and the second distance d2 and the difference between the third distance d3 and the fourth distance d4 is a positive value. For example, by making the product of the difference between the first distance d1 and the second distance d2 and the difference between the third distance d3 and the fourth distance d4 positive, the uniformity of the display performance of the display module can be improved. For example, by making the product of the difference between the first distance d1 and the second distance d2 and the difference between the third distance d3 and the fourth distance d4 positive, the distance between the adjacent first flexible circuit board 120 and second flexible circuit board 220 can be a fixed value. It should be noted that, the adjacent first flexible circuit board 120 and second flexible circuit board 220 mean that no other circuit board is provided between the above-mentioned adjacent first flexible circuit board 120 and second flexible circuit board 220 (for example, no other first flexible circuit board 120 or second flexible circuit board 220 is provided between the above-mentioned adjacent first flexible circuit board 120 and second flexible circuit board 220). For example, as illustrated in FIG. 19 to FIG. 22, the first distance d1 is smaller than the second distance d2, and the third distance d3 is smaller than the fourth distance d4.

Figure 23A:
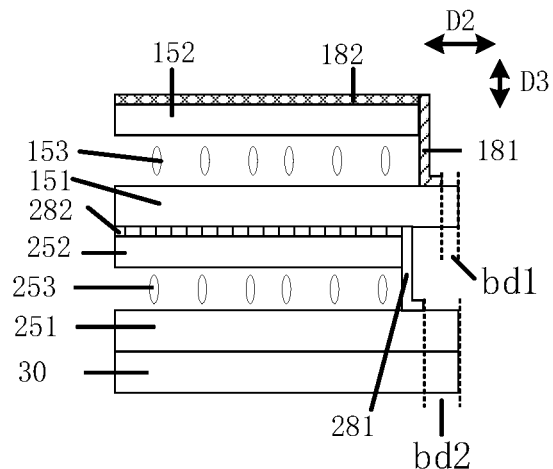
FIG. 23A is a cross-sectional view of the display module illustrated in FIG. 3 along a line D-D'.
Figure 23B:
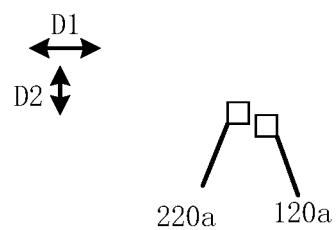
FIG. 23B is a schematic diagram of a bonding position of the first flexible circuit board with the display panel and a bonding position of the second flexible circuit board with the light control panel of the display module illustrated in FIG. 3.

FIG. 23A is a cross-sectional view of the display module 01 illustrated in FIG. 3 along a line D-D', and FIG. 23B is a schematic diagram of a bonding position of the first flexible circuit board 120 with the display panel 10 and a bonding position of the second flexible circuit board 220 with the light control panel 20 of the display module 01 illustrated in FIG. 3. For example, as illustrated in FIG. 23A, the display panel 10 further includes a first conductive structure 181 and a first shielding layer 182, and the first conductive structure 181 is electrically connected to the first shielding layer 182; and the light control panel 20 further includes a second conductive structure 281 and a second shielding layer 282, and the second conductive structure 281 is electrically connected to the second shielding layer 282. For example, the first shielding layer 182 and the second shielding layer 282 may be made of transparent conductive oxide. For example, the transparent conductive oxide may be indium tin oxides (ITO) or other suitable materials. For example, the first shielding layer 182 and the second shielding layer 282 are configured to be grounded through the first conductive structure 181 and the second conductive structure 281, respectively, so that the first shielding layer 182 and the second shielding layer 282 can be used to reduce the adverse effect of the external electrical signal on the display panel 10 and the light control panel 20.

For example, as illustrated in FIG. 23A, the first shielding layer 182 is located on a side of the first opposite substrate 152 away from the first liquid crystal layer 153, and the second shielding layer 282 is located between the first array substrate 151 and the second opposite substrate 252.

For example, as illustrated in FIG. 23A, the first shielding layer 182 and the second shielding layer 282 are stacked, and at least part of the first shielding layer 182 and at least part of the second shielding layer 282 are located in the display region of the display module. The first conductive structure 181 and at least part of the second conductive structure 281 are located in the peripheral region of the display module.

For example, as illustrated in FIG. 23A, two ends of the first conductive structure 181 are in direct contact with the first opposite substrate 152 and the first array substrate 151, respectively, and two ends of the second conductive structure 281 are in direct contact with the second array substrate and the second shielding layer, respectively.

For example, as illustrated in FIG. 3 and FIG. 23A, the distance from the center of the display module 01 to the edge of the orthographic projection of the first conductive structure 181 on the first surface close to the center of the display module 01 is different from the distance from the center of the display module 01 to the edge of the orthographic projection of the second conductive structure 281 on the first surface close to the center of the display module 01.

For example, as illustrated in FIG. 3 and FIG. 23A, the distance from the center of the display module 01 to the edge of the orthographic projection of the first conductive structure 181 on the first surface close to the center of the display module 01 is greater than the distance from the center of the display module 01 to the edge of the orthographic projection of the second conductive structure 281 on the first surface close to the center of the display module 01, so that the width of the first pad region bd1 of the display panel 10 in the second direction D2 is smaller than the width of the second pad region bd2 of the light control panel 20 in the second direction D2. In this case, the bonding position 120*a* of the first flexible circuit board with the display panel 10 and the bonding position 220*a* of the second flexible circuit board with the light control panel 20 are at least partially staggered in the second direction D2 (referring to FIG. 23B), thereby further reducing the possibility of heat concentration generated by the display module 01 during operation and the possibility of poor display caused by the heat concentration.

It should be noted that although FIG. 3 shows that any one of the at least one first circuit board 110 used for the display panel 10 and the at least one second circuit board 210 (for example, all the second circuit boards 210) used for the light control panel 20 of the display module 01 do not overlap in the direction perpendicular to the first surface, and the orthographic projection of any one of the at least one first flexible circuit board 120 on the first surface and the orthographic projection of the at least one second flexible circuit board 220 (for example, all the second flexible circuit boards 220) on the first surface do not overlap in the direction perpendicular to the first surface, at least one embodiment of the present disclosure is not limited thereto.

In the first example, any one of the at least one first circuit board 110 used for the display panel 10 and the at least one second circuit board 210 (for example, all the second circuit boards 210) used for the light control panel 20 do not overlap in the direction perpendicular to the first surface, but the orthographic projection of the at least one first flexible circuit board 120 on the first surface and the orthographic projection of the at least one second flexible circuit board 220 on the first surface at least partially overlap in the direction perpendicular to the first surface.

In the second example, the at least one first circuit board 110 used for the display panel 10 and the at least one second circuit board 210 used for the light control panel 20 at least partially overlap in the direction perpendicular to the first surface, but the orthographic projection of any one of the at least one first flexible circuit board 120 on the first surface and the orthographic projection of the at least one second flexible circuit boards 220 (for example, all the second flexible circuit boards 220) on the first surface do not overlap in the direction perpendicular to the first surface.

For the display module 01 of the first example and the second example, the possibility of poor display caused by friction can also be reduced to a certain extent.

For example, in addition to the above difference, the display module 01 of the first example and the second example described above is the same as or similar to the display module 01 illustrated in FIG. 3 to FIG. 23B. The specific description may be referred to the display module 01 illustrated in FIG. 3 to FIG. 23B, and details will not be repeated here. It should be noted that the display module 01 illustrated in FIG. 3 to FIG. 23B may also have a touch function, and the structure of the display module 01 illustrated in FIG. 3 to FIG. 23B for realizing the touch function is the same as or similar to that of the display module illustrated in FIG. 25 to FIG. 31, and details will not be repeated here.

At least one embodiment of the present disclosure further provides another display module, and the display module includes a display panel, a light control panel, at least one first circuit board for the display panel, at least one second circuit board for the light control panel, at least one first flexible circuit board, and at least one second flexible circuit board. The display panel and the light control panel are stacked; the display panel is on a light-emitting side of the light control panel; a first end of the at least one first flexible circuit board is bonded to the display panel, and a second end of the at least one first flexible circuit board is bonded to the at least one first circuit board; a first end of the at least one second flexible circuit board is bonded to the light control panel, and a second end of the at least one second flexible circuit board is bonded to the at least one second circuit board; a light-emitting surface of the display panel is on a first surface; and an orthographic projection of any one of the at least one first flexible circuit board on the first surface does not overlap with an orthographic projection of the at least one second flexible circuit board on the first surface in a direction perpendicular to the first surface.

Figure 24:
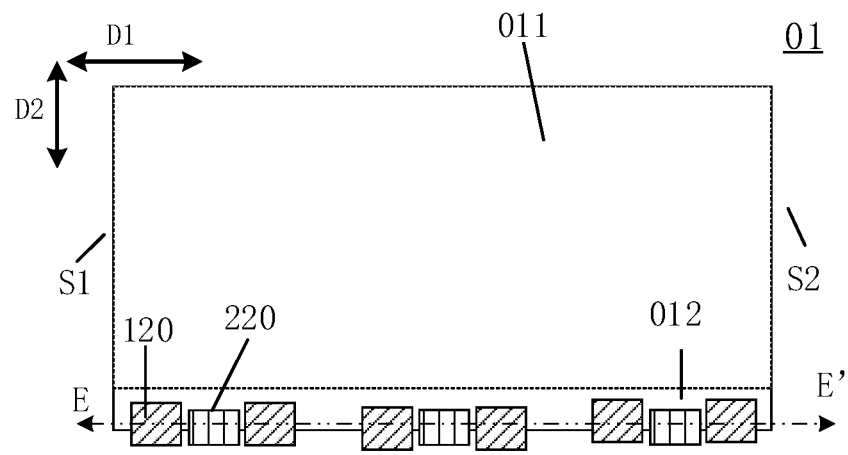
FIG. 24 is a front view of another display module provided by at least one embodiment of the present disclosure.

FIG. 24 is a front view of another display module provided by at least one embodiment of the present disclosure. For example, as illustrated in FIG. 24, the display module includes a display panel 10, a backlight unit 30, a light control panel 20, at least one first circuit board 110 (not shown in FIG. 24) for the display panel 10, at least one second circuit board 210 (not shown in FIG. 24) for the light control panel 20, at least one first flexible circuit board 120, and at least one second flexible circuit board 220. For example, the display panel 10, the light control panel 20, and the backlight unit 30 are stacked; the display panel 10 is located on a light-emitting side of the light control panel 20; the backlight unit 30 is located on a side of the light control panel 20 away from the display panel 10; a first end of the at least one first flexible circuit board 120 is bonded to the display panel 10, and a second end of the at least one first flexible circuit board 120 is bonded to the at least one first circuit board 110; a first end of the at least one second flexible circuit board 220 is bonded to the light control panel 20, and a second end of the at least one second flexible circuit board 220 is bonded to the at least one second circuit board 210; a light-emitting surface of the display panel 10 is located on a first surface; and an orthographic projection of any one of the at least one first flexible circuit board 120 on the first surface does not overlap with an orthographic projection of the at least one second flexible circuit board 220 on the first surface in a direction perpendicular to the first surface.

For example, by allowing the orthographic projection of any one of the at least one first flexible circuit board 120 on the first surface not to overlap with the orthographic projection of the at least one second flexible circuit board 220 on the first surface in the direction perpendicular to the first surface, the possibility of friction between the at least one first circuit board 110 used for the display panel 10 and the at least one second circuit board 210 used for the light control panel 20 can be reduced, and further the possibility of poor display due to friction can be reduced.

For example, at least one embodiment of the present disclosure further provides another display module 01, in which any one of the at least one first circuit board 110 used for the display panel 10 does not overlap with the at least one second circuit board 210 (for example, all the second circuit boards 210) used for the light control panel 20 in the direction perpendicular to the first surface. In this case, the above-mentioned another display module 01 is the same as or similar to the display module 01 according to the second example, and details will not be repeated here.

For another example, the at least one first circuit board 110 used for the display panel 10 and the at least one second circuit board 210 used for the light control panel 20 at least partially overlap in the direction perpendicular to the first surface. In this case, the above-mentioned another display module 01 is the same as or similar to the display module 01 illustrated in FIG. 3 to FIG. 23B, and details will not be repeated here.

For example, the at least one first circuit board 110 and the at least one second circuit board 210 are located on a side of the light control panel 20 away from the display panel 10. For example, the at least one first circuit board 110 and the at least one second circuit board 210 are located on a side of the backlight unit 30 away from the display panel 10.

At least one embodiment of the present disclosure provides still another display module, which includes a display panel 10 and a light control panel 20. The display panel 10 and the light control panel 20 are stacked; the display panel 10 is located on a light-emitting side of the light control panel 20; the display panel 10 includes a third common electrode 140 that is at least partially located (for example, fully or partially located) in a display region of the display module 01; and the third common electrode 140 further serves as a touch electrode of the display module 01.

For example, by allowing the display panel 10 to include the third common electrode 140 which is located in the display region of the display module 01 and allowing the third common electrode 140 to further serve as the touch electrode of the display module 01, the display module 01 can have a touch function without being added an additional electrode layer.

Figure 25:
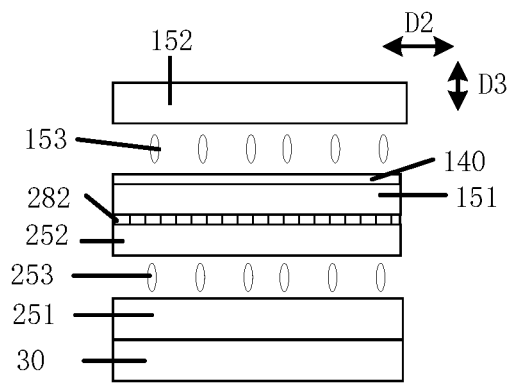
FIG. 25 is a schematic diagram of a first example of still another display module provided by at least one embodiment of the present disclosure.

FIG. 25 is a schematic diagram of a first example of still another display module 01 provided by at least one embodiment of the present disclosure. For example, as illustrated in FIG. 25, the display module 01 includes a display panel 10, a backlight unit 30, and a light control panel 20. The display panel 10, the light control panel 20, and the backlight unit 30 are stacked (for example, arranged in sequence) in the third direction D3. The display panel 10 is located on a light-emitting side of the light control panel 20, and the backlight unit 30 is located on a side of the light control panel 20 away from the display panel 10.

For example, as illustrated in FIG. 25, the display panel 10 includes a third common electrode 140 located in the display region of the display module 01, and the third common electrode 140 further serves as a touch electrode of the display module 01.

For example, by allowing the display panel 10 to include the third common electrode 140 which is located in the display region of the display module 01 and allowing the third common electrode 140 to further serve as the touch electrode of the display module 01, the display module 01 can have a touch function without being added an additional electrode layer.

Figure 26:
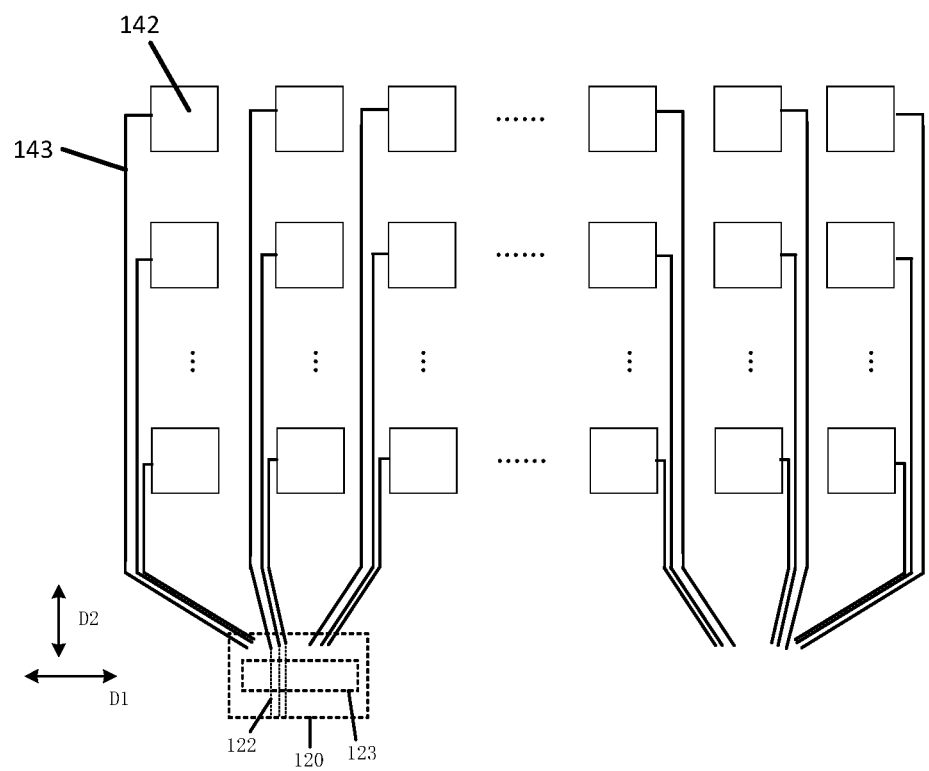
FIG. 26 is a schematic planar diagram of a third common electrode and a first touch wire illustrated in FIG. 25.

FIG. 26 is a schematic planar diagram of a third common electrode 140 and a first touch wire 143 illustrated in FIG. 25. For example, as illustrated in FIG. 26, the third common electrode 140 includes a plurality of self-capacitance electrodes 142 arranged in an array.

It should be noted that the third common electrode 140 and the first touch wire 143 illustrated in FIG. 26 are only used to illustrate the electrical connection relationship between the self-capacitance electrode 142, the first touch wire 143, and the first flexible circuit board 120. However, the arrangement of the third common electrode 140 and the arrangement of the first touch wire 143 of at least one embodiment of the present disclosure are not limited to the arrangements illustrated in FIG. 26.

For example, as illustrated in FIG. 26, the display module 01 further includes at least one first flexible circuit board 120; the display panel 10 further includes a first touch wire 143; at least one first flexible circuit board 120 includes a plurality of third wires 122; the first end of each of the plurality of third wires 122 is electrically connected to the corresponding self-capacitance electrode 142 through the corresponding first touch wire 143, and the second end of each of the plurality of third wires 122 is electrically connected to the corresponding first circuit board 110.

For example, as illustrated in 26, the first flexible circuit board 120 further includes a first chip 123. For example, the first chip 123 may be a touch and display driver integration (TDDI). For example, the first chip 123 is configured to apply driving signals to the corresponding self-capacitance electrodes 142 through the plurality of third wires 122 included in the first flexible circuit board 120, and the first chip 123 is also configured to receive feedback signals (touch sensing signals) provided by the corresponding self-capacitance electrodes 142 through the plurality of third wires 122 included in the first flexible circuit board 120, and based on the feedback signals, determine whether there is a self-capacitance electrode 142 being touched and a position (that is, a touch position) of the self-capacitance electrode 142 being touched.

For example, each of the plurality of third wires 122 may include two third sub-wires arranged side by side in the second direction D2; two ends of the third sub-wire at least partially located between the first touch wire 143 and the first chip 123 are electrically connected to the first touch wire 143 and the first chip 123, respectively; and two ends of the third sub-wire at least partially located between the first circuit board 110 and the first chip 123 are electrically connected to the first circuit board 110 and the first chip 123, respectively.

For example, as illustrated in FIG. 25, the display panel 10 further includes a first array substrate 151, a first liquid crystal layer 153, and a first opposite substrate 152; and the light control panel 20 includes a second array substrate 251, a second liquid crystal layer 253, a second opposite substrate 252, and a second shielding layer 282. For example, as illustrated in FIG. 25, the backlight unit 30, the second array substrate 251, the second liquid crystal layer 253, the second opposite substrate 252, the second shielding layer 282, the first array substrate 151, the first liquid crystal layer 153, and the first opposite substrate 152 are sequentially arranged in the third direction D3. For example, as illustrated in FIG. 25, the first array substrate 151 includes a third common electrode 140. For example, the third common electrode 140 and the second shielding layer 282 may be made of transparent conductive oxide. For example, the transparent conductive oxide may be indium tin metal oxide or other suitable materials.

The inventors of the present disclosure have noticed in research that, for the display module 01 illustrated in FIG. 25, the display panel 10 includes a fixed capacitance between the third common electrode 140 and the second shielding layer 282, and the fixed capacitance between the third common electrode 140 and the second shielding layer 282 adversely affects the touch effect of the display module 01 illustrated in FIG. 25.

The inventors of the present disclosure have noticed in research that for the display module 01 illustrated in FIG. 25, at least one of the following three methods can be used to prevent the adverse effect of the fixed capacitance between the third common electrode 140 and the second shielding layer 282 on the touch effect of the display module 01. The first method is to increase the touch determination threshold. The second method is to increase the distance between the third common electrode 140 and the second shielding layer 282 to reduce the fixed capacitance between the third common electrode 140 and the second shielding layer 282. For example, the distance between the third common electrode 140 and the second shielding layer 282 can be increased by disposing an insulating layer between the first array substrate 151 and the second opposite substrate 252. The third method is to change the touch based on self-capacitance to the touch based on mutual capacitance. The third method will be exemplarily described below in conjunction with FIG. 26 and FIG. 27A.

Figure 27A:
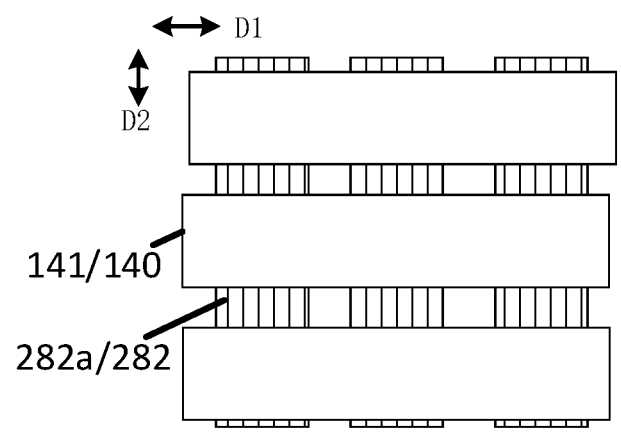
FIG. 27A is a schematic planar diagram of the third common electrode and a second shielding electrode layer illustrated in FIG. 25.

FIG. 27A is a schematic planar diagram of the third common electrode 140 and the second shielding electrode layer 281 illustrated in FIG. 25. For example, as illustrated in FIG. 27A, the third common electrode 140 includes a plurality of first strip-shaped electrodes 141 arranged side by side in the second direction D2; the second shielding layer 282 includes a plurality of third strip-shaped electrodes 282a arranged side by side in the first direction D1; and the plurality of first strip-shaped electrodes 141 and the plurality of third strip-shaped electrodes 282a as a whole further serve as touch electrodes based on mutual capacitance. For example, the plurality of first strip-shaped electrodes 141 and the plurality of third strip-shaped electrodes 282a generate a plurality of mutual capacitances arranged in an array. When a finger touches the screen, the capacitance value of the mutual capacitance in the region corresponding to the finger will change.

Figure 27B:
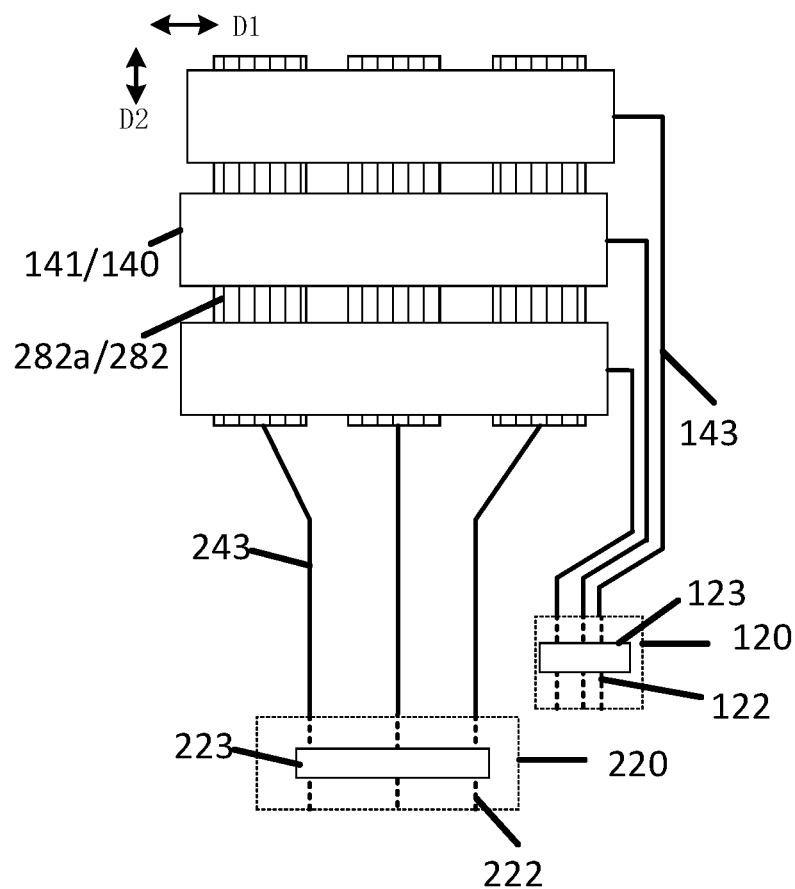
FIG. 27B shows an example of an electrical connection relationship of the third common electrode and the second shielding electrode layer illustrated in FIG. 27A with the first flexible circuit board and the second flexible circuit board.

FIG. 27B shows an example of an electrical connection relationship between the third common electrode 140 and the second shielding electrode layer 281 illustrated in FIG. 27A with the first flexible circuit board and the second flexible circuit board.

In the first example, as illustrated in FIG. 27B, the plurality of third strip-shaped electrodes 282a may be electrically connected to the fourth wires 222 included in the second flexible circuit board 220 through the second touch wires 243. The plurality of first strip-shaped electrodes 141 may be electrically connected to the third wires 122 included in the first flexible circuit board 120 through the first touch wires 241. For example, the plurality of first strip-shaped electrodes 141 may be touch driving electrodes, and the plurality of third strip-shaped electrodes 282a may be touch sensing electrodes. In this case, the first chip 123 on the first flexible circuit board 120 may provide a touch driving signal to the touch driving electrode (that is, the first strip-shaped electrode 141) through the first flexible circuit board 120, and the second chip 223 on the second flexible circuit board 220 may receive a touch sensing signal provided by the touch sensing electrode (that is, the third strip-shaped electrode 282a) through the second flexible circuit board 220. For example, the second chip 223 may determine the position of the touch point of the finger based on the change of the touch sensing signal before and after touch. For another example, the plurality of first strip-shaped electrodes 141 may be touch sensing electrodes, and the plurality of third strip-shaped electrodes 282a may be touch driving electrodes.

In the second example, the plurality of third strip-shaped electrodes 282a may be electrically connected to the fourth wires 222 included in the first flexible circuit board 120 through the second touch wires 243. The plurality of first strip-shaped electrodes 141 may be electrically connected to the third wires 122 included in the first flexible circuit board 120 through the first touch wires 241. For example, the plurality of first strip-shaped electrodes 141 may be touch driving electrodes, and the plurality of third strip-shaped electrodes 282a may be touch sensing electrodes. In this case, the first chip 123 on the first flexible circuit board 120 may provide a touch driving signal to the touch driving electrode (that is, the first strip-shaped electrode 141) through the first flexible circuit board 120, receive a touch sensing signal provided by the touch sensing electrode (that is, the third strip-shaped electrode 282a) through the first flexible circuit board 120, and determine the position of the touch point of the finger based on the change of the touch sensing signal before and after touch. For another example, the plurality of first strip-shaped electrodes 141 may be touch sensing electrodes, and the plurality of third strip-shaped electrodes 282a may be touch driving electrodes.

For example, since the touch control based on mutual capacitance is realized by detecting the signal change value between the touch driving electrode and the touch sensing electrode, the display module 01 that realizes touch control based on the mutual capacitance has stronger anti-interference ability. For example, since the distance between the third common electrode 140 and the second shielding layer 282 is relatively small, the capacitance between the third common electrode 140 and the second shielding layer 282 is relatively large. Thus, in the case where the widths of the third common electrodes 140 and the widths of the third strip-shaped electrodes 282a are small, the capacitance between the third common electrode 140 and the second shielding layer 282 can also achieve a good touch effect. In this case, the touch resolution of the display module 01 can be improved. For example, the distance between the third common electrode 140 and the second shielding layer 282 can be further reduced by fabricating the first array substrate 151 and the second opposite substrate 252 based on the same base substrate, thereby further improving the touch resolution of the display module 01.

For example, the display panel 10 includes a third common electrode 140 located in the display region of the display module 01; the light control panel 20 includes the fourth common electrode 240 at least partially located (for example, fully or partially located) in the display region of the display module 01; and the third common electrode 140 and the fourth common electrode 240 are located between the first liquid crystal layer 153 and the second liquid crystal layer 253 included in the display module 01. An exemplary description will be given below with reference to FIG. 28 to FIG. 30. For example, by allowing the third common electrode 140 and the fourth common electrode 240 to be located between the first liquid crystal layer 153 and the second liquid crystal layer 253 included in the display module 01, the capacitance between the third common electrode 140 and the fourth common electrode 240 can be improved, and further the touch resolution of the display module 01 can be improved.

Figure 28:
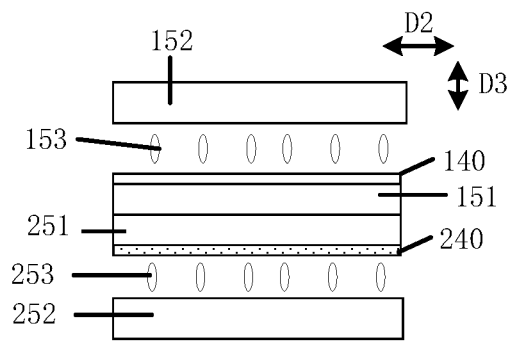
FIG. 28 is a schematic diagram of a second example of still another display module provided by at least one embodiment of the present disclosure.

FIG. 28 is a schematic diagram of a second example of still another display module 01 provided by at least one embodiment of the present disclosure. For example, as illustrated in FIG. 28, the display module 01 includes a display panel 10, a backlight unit 30, and a light control panel 20. The display panel 10, the light control panel 20, and the backlight unit 30 are stacked (for example, stacked in sequence) in the third direction D3. The display panel 10 is located on a light-emitting side of the light control panel 20, and the backlight unit 30 is located on a side of the light control panel 20 away from the display panel 10. For example, as illustrated in FIG. 28, the display panel 10 further includes a first array substrate 151, a first liquid crystal layer 153, and a first opposite substrate 152, and the light control panel 20 includes a second array substrate 251, a second liquid crystal layer 253, a second opposite substrate 252, and a second shielding layer 282.

For example, as illustrated in FIG. 28, the display panel 10 includes a third common electrode 140 located in the display region of the display module 01, and the light control panel 20 includes a fourth common electrode 240 located in the display region of the display module 01.

Figure 29A:
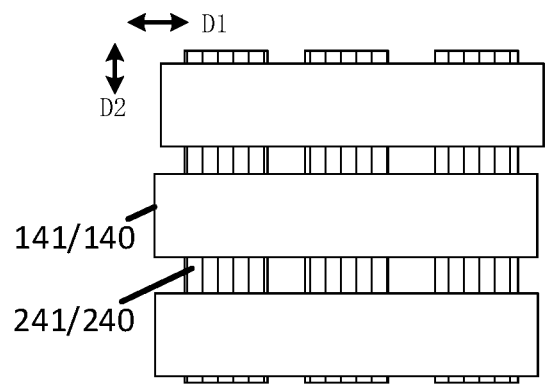
FIG. 29A is a schematic planar diagram of the third common electrode in the display panel and a fourth common electrode in the light control panel illustrated in FIG. 28.

FIG. 29A is a schematic planar diagram of the third common electrode 140 included in the display panel 10 and the fourth common electrode 240 included in the light control panel 20 illustrated in FIG. 28.

For example, as illustrated in FIG. 29A, the third common electrode 140 includes a plurality of first strip-shaped electrodes 141 arranged side by side in the second direction D2, the fourth common electrode 240 includes a plurality of second strip-shaped electrodes 241 arranged side by side in the second direction D2 crossing the first direction D1, and the plurality of first strip-shaped electrodes 141 and the plurality of second strip-shaped electrodes 241 as a whole further serve as the touch electrodes based on mutual capacitance.

For example, as illustrated in FIG. 28, the third common electrode 140 and the fourth common electrode 240 are located between the first liquid crystal layer 153 and the second liquid crystal layer 253. For example, as illustrated in FIG. 28, the third common electrode 140 and the fourth common electrode 240 are located in the first array substrate 151 and the second array substrate 251, respectively.

For example, one of the third common electrode 140 and the fourth common electrode 240 may be used as a touch driving electrode layer, and the other of the third common electrode 140 and the fourth common electrode 240 may be used as a touch sensing electrode layer.

Figure 29B:
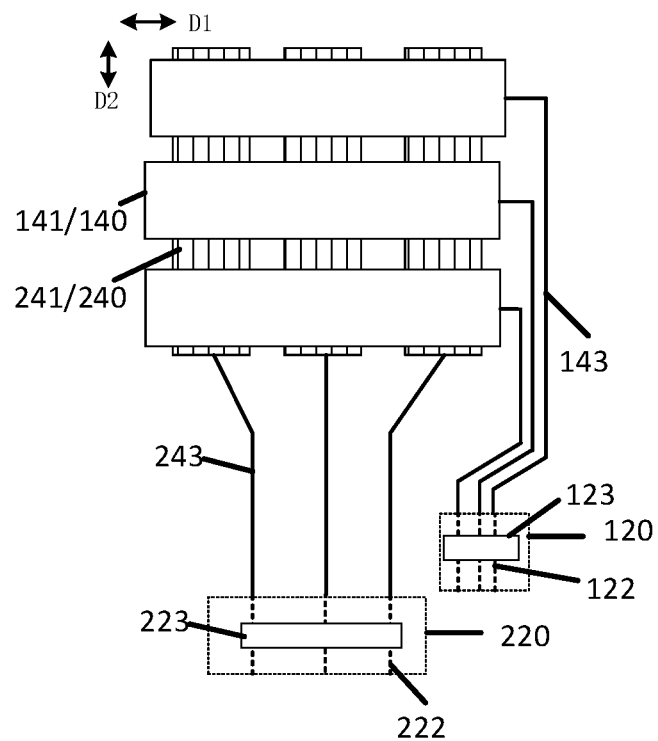
FIG. 29B is an example of an electrical connection relationship of the third common electrode and the fourth common electrode illustrated in FIG. 29A with the first flexible circuit board and the second flexible circuit board.

FIG. 29B shows an example of an electrical connection relationship between the third common electrode and the fourth common electrode illustrated in FIG. 29A with the first flexible circuit board and the second flexible circuit board.

In the first example, the third common electrode 140 may be used as a touch driving electrode layer, and the fourth common electrode 240 may be used as a touch sensing electrode layer. Correspondingly, the plurality of first strip-shaped electrodes 141 may be touch driving electrodes, and the plurality of second strip-shaped electrodes 241 may be touch sensing electrodes. For example, as illustrated in FIG. 29B, the plurality of second strip-shaped electrodes 241 may be electrically connected to the fourth wires 222 included in the second flexible circuit board 220 through the second touch wires 243. In this case, the first chip 123 on the first flexible circuit board 120 can provide a touch driving signal to the touch driving electrode (that is, the first strip-shaped electrode 141) through the first flexible circuit board 120, and the second chip 223 on the second flexible circuit board 220 can receive a touch sensing signal provided by the touch sensing electrode (that is, the second strip-shaped electrode 241) through the second flexible circuit board 220. For example, the second chip 223 may determine the position of the touch point of the finger based on the change of the touch sensing signal before and after touch.

In the second example, the third common electrode 140 may be used as a touch sensing electrode layer, and the fourth common electrode 240 may be used as a touch driving electrode layer. Correspondingly, the plurality of first strip-shaped electrodes 141 may be touch sensing electrodes, and the plurality of second strip-shaped electrodes 241 may be touch driving electrodes. For example, as illustrated in FIG. 29B, the plurality of second strip-shaped electrodes 241 may be electrically connected to the fourth wires 222 included in the second flexible circuit board 220 through the second touch wires 243. In this case, the second chip 223 on the second flexible circuit board 220 can provide a touch driving signal to the touch driving electrode (that is, the second strip-shaped electrode 241) through the second flexible circuit board 220, and the first chip 123 on the first flexible circuit board 120 can receive a touch sensing signal provided by the touch sensing electrode (that is, the first strip-shaped electrode 141) through the first flexible circuit board 120. For example, the first chip 123 may determine the position of the touch point of the finger based on the change of the touch sensing signal before and after touch.

It should be noted that, for the above two examples, the third common electrode and the fourth common electrode may also be electrically connected to the same chip (for example, the first chip 123 or the second chip 223), which will not be repeated here.

For example, for the above two examples, the display panel 10 and the light control panel 20 may both have a touch holding function. Here, the touch holding function refers to: at the beginning of each touch phase, the row scanning of the panel is terminated, and at the end of each touch phase, the row scanning of the panel starts again from the position where the scanning is terminated. For example, in the case where the display panel 10 and the light control panel 20 both have a touch holding function, the touch phases of the display panel 10 and the light control panel 20 are synchronized, that is, the row scanning of the display panel 10 and the light control panel 20 may simultaneously end, and then start again at the same time.

For example, for the above two examples, the light control panel 20 has a touch holding function but the display panel does not have a touch holding function. In this case, the plurality of first strip-shaped electrodes 141 may be touch sensing electrodes, and the plurality of second strip-shaped electrodes 241 may be touch driving electrodes.

The inventors of the present disclosure have noticed in research that in the case where the light control panel 20 has a touch holding function but the display panel does not have a touch holding function, the change of the electrical signal of at least part of the first strip-shaped electrodes 141 included in the third common electrode 240 caused by the touch operation causes the problem that the intensity of the light emitted by the display module 01 fluctuates over time.

For example, touch driving signals may be applied to the plurality of second strip-shaped electrodes 241, the fluctuation values of the signals obtained from the plurality of first strip-shaped electrodes 141 are extracted, and the fluctuation values are used to compensate for the brightness of the display module 01, so as to suppress the problem that the intensity of the light emitted by the display module 01 fluctuates over time caused by the touch operation.

For example, for the display module 01 illustrated in FIG. 28, the second opposite substrate 252, the second liquid crystal layer 253, the second array substrate 251, the first array substrate 151, the first liquid crystal layer 153, and the first opposite substrate 152 are sequentially arranged in the third direction D3. The first array substrate 151 includes a third common electrode 140, the second array substrate 251 includes a fourth common electrode 240, and the first array substrate 151 and the second array substrate 251 are located between the first liquid crystal layer 153 and the second liquid crystal layer 253. For example, the display module 01 illustrated in FIG. 28 may be a display module based on advanced super dimension switch (ADS) technology.

Figure 30:
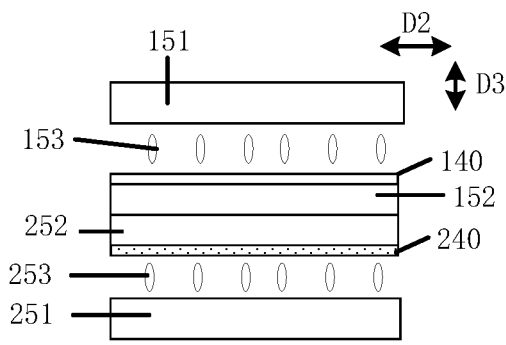
FIG. 30 is a schematic diagram of a third example of still another display module provided by at least one embodiment of the present disclosure.

FIG. 30 is a schematic diagram of a third example of still another display module 01 provided by at least one embodiment of the present disclosure. The display module 01 illustrated in FIG. 30 is similar to the display module 01 illustrated in FIG. 28, and the difference includes that the third common electrode 140 and the fourth common electrode 240 of the display module 01 illustrated in FIG. 30 are respectively located in the first opposite substrate 152 and the second opposite substrate 252, but not located in the first array substrate 151 and the second array substrate 251. For example, for the display module 01 illustrated in FIG. 30, the second array substrate 251, the second liquid crystal layer 253, the second opposite substrate 252, the first opposite substrate 152, the first liquid crystal layer 153, and the first array substrate 151 are sequentially arranged in the third direction D3. The first opposite substrate 152 and the second opposite substrate 252 are located between the first liquid crystal layer 153 and the second liquid crystal layer 253, so that the third common electrode 140 and the fourth common electrode 240 are also located between the first liquid crystal layer 153 and the second liquid crystal layer 253. For example, the display module 01 illustrated in FIG. 30 may be a display module based on vertical alignment (VA) technology.

Figure 31:
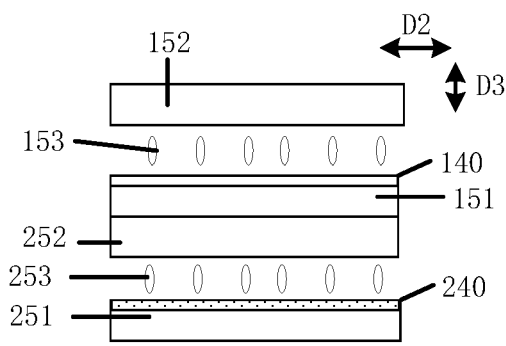
FIG. 31 is a schematic diagram of a fourth example of still another display module provided by at least one embodiment of the present disclosure.

FIG. 31 is a schematic diagram of a fourth example of still another display module 01 provided by at least one embodiment of the present disclosure. The display module 01 illustrated in FIG. 30 is similar to the display module 01 illustrated in FIG. 28, and the difference includes that the second opposite substrate 252, the second liquid crystal layer 253, the second array substrate 251, the first opposite substrate 152, the first liquid crystal layer 153, and the first array substrate 151 are sequentially arranged in the third direction D3, so that the third common electrode 140 included in the first array substrate 151 and the fourth common electrode 240 included in the second array substrate 251 are located on both sides of the second liquid crystal layer 253 in the direction (i.e., the third direction D3) in which the light control panel 20 and the display panel 10 are stacked.

It should be noted that the still another display module provided by at least one embodiment of the present disclosure provides can also reduce the possibility of poor display of the display module caused by friction by using at least one of the following two methods: allowing any one of the at least one first circuit board 110 of the display panel 10 not to overlap with the at least one second circuit board 210 (for example, all the second circuit boards 210) used for the light control panel 20 in the direction perpendicular to the first surface; and allowing the orthographic projection of any one of the at least one first flexible circuit board 120 on the first surface not to overlap with the orthographic projection of the at least one second flexible circuit board 220 (for example, all the second flexible circuit boards 220) on the first surface in the direction perpendicular to the first surface. Details may be referred to the display module 01 (or the components of the display module 01) illustrated in FIG. 3 to FIG. 23B, which will not be repeated here.

Figure 32:
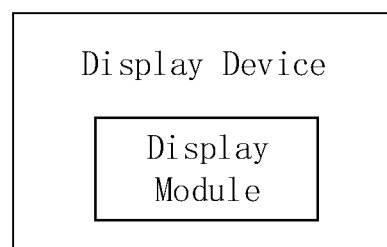
FIG. 32 is an exemplary block diagram of a display device provided by at least one embodiment of the present disclosure.

At least one embodiment of the present disclosure further provides a display device. FIG. 32 is an exemplary block diagram of a display device provided by at least one embodiment of the present disclosure. As illustrated in FIG. 32, the display device includes any display module provided by at least one embodiment of the present disclosure.

It should be noted that other components of the display device (for example, an image data encoding/decoding device, a clock circuit, etc.) may adopt applicable components, which should be understood by those skilled in the art, and details are not described herein, which should not be regarded as a limitation to the present disclosure. The display device provided by any one of the embodiments of the present disclosure may be any product or component with a display function, such as a mobile phone, a tablet computer, a television, a monitor, a notebook computer, a digital photo frame, a navigator, etc.

Although the present disclosure has been described in detail with the general descriptions and specific embodiments above, some modifications or improvements can be made based on the embodiments of the present disclosure, which is obvious to those skilled in the art. Therefore, these modifications or improvements made on the basis of not deviating from the spirit of the present disclosure fall within the protection scope of the present disclosure.

The above descriptions are only exemplary embodiments of the present disclosure, and are not used to limit the protection scope of the present disclosure, the protection scope of the present disclosure is determined by the claims.

What is claimed is:

1. A display module, comprising: a display panel, a light control panel, at least one first circuit board for the display panel, and at least one second circuit board for the light control panel,
   wherein the display panel and the light control panel are stacked,
   a light-emitting surface of the display panel is on a first surface, and
   at least part of an orthographic projection of any one of the at least one first circuit board on the first surface does not overlap with an orthographic projection of the at least one second circuit board on the first surface in a direction perpendicular to the first surface;
   the at least one first circuit board and the at least one second circuit board respectively extend in a first direction, and an edge, extending in a direction perpendicular to the first direction, of the at least one first circuit board in the first direction is not flush with a corresponding edge, extending in the direction perpendicular to the first direction, of the at least one second circuit board in the first direction;

the display module further comprises at least one first flexible circuit board and at least one second flexible circuit board, a first end of the at least one first flexible circuit board is bonded to the display panel, and a second end of the at least one first flexible circuit board is bonded to the at least one first circuit board;

a first end of the at least one second flexible circuit board is bonded to the light control panel, and a second end of the at least one second flexible circuit board is bonded to the at least one second circuit board;

the at least one first flexible circuit board comprises a plurality of first flexible circuit boards, an orthographic projection of any one of the plurality of first flexible circuit board on the first surface and an orthographic projection of the at least one second flexible circuit board on the first surface are arranged at an interval in the first direction, and the orthographic projection of the at least one second flexible circuit board on the first surface is respectively between orthographic projections of adjacent first flexible circuit boards of the plurality of first flexible circuit board on the first surface.

2. The display module according to claim 1, wherein the at least one first circuit board and the at least one second circuit board are on a side of the light control panel away from the display panel.

3. The display module according to claim 2, wherein each of the at least one first flexible circuit board comprises a plurality of first wires, and the plurality of first wires are respectively electrically connected to a first number of first signal lines comprised in the display panel;

each of the at least one second flexible circuit board comprises a plurality of second wires, and the plurality of second wires are respectively electrically connected to a second number of second signal lines comprised in the light control panel; and a number of the plurality of first wires is greater than or equal to a number of the plurality of second wires.

4. The display module according to claim 3, wherein the number of the plurality of first wires is substantially equal to three times the number of the plurality of second wires;

a width of each of the at least one first flexible circuit board in a first direction is greater than or equal to a width of each of the at least one second flexible circuit board in the first direction; and each of the first number of first signal lines extends in a second direction crossing the first direction as a whole.

5. The display module according to claim 2, wherein an orthographic projection of the at least one first circuit board on the first surface at least partially overlaps with the orthographic projection of the at least one second circuit board on the first surface in a second direction crossing the first direction; and the orthographic projection of the at least one first circuit board on the first surface and the orthographic projection of the at least one second circuit board on the first surface are arranged at an interval in the second direction.

6. The display module according to claim 1, wherein the plurality of first flexible circuit boards are arranged side by side in the first direction;

the at least one second flexible circuit board comprises a plurality of second flexible circuit boards arranged side by side in the first direction; and a number of the plurality of first flexible circuit boards is greater than or equal to a number of the plurality of second flexible circuit boards.

7. The display module according to claim 6, wherein the at least one first circuit board comprises a plurality of first circuit boards arranged side by side in the first direction;

the at least one second circuit board comprises a plurality of second circuit boards arranged side by side in the first direction;

a number of first flexible circuit boards bonded to each of the plurality of first circuit boards is equal to a number of second flexible circuit boards bonded to each of the plurality of second circuit boards; and a length of each of the plurality of first circuit boards in the first direction is smaller than a length of each of the plurality of second circuit boards in the first direction.

8. The display module according to claim 1, wherein the display panel comprises a first conductive structure and a first shielding layer, and the first conductive structure is electrically connected to the first shielding layer;

the light control panel comprises a second conductive structure and a second shielding layer, and the second conductive structure is electrically connected to the second shielding layer;

the first shielding layer and the second shielding layer are stacked with each other, and at least part of the first shielding layer and at least part of the second shielding layer are in a display region of the display module;

at least part of the first conductive structure and at least part of the second conductive structure are in a peripheral region of the display module; and a distance from a center of the display module to an edge, close to the center of the display module, of an orthographic projection of the first conductive structure on the first surface is greater than a distance from the center of the display module to an edge, close to the center of the display module, of an orthographic projection of the second conductive structure on the first surface.

9. The display module according to claim 8, wherein the display panel further comprises a first opposite substrate, a first liquid crystal layer, and a first array substrate;

the light control panel further comprises a second opposite substrate, a second liquid crystal layer, and a second array substrate;

the first shielding layer, the first opposite substrate, the first liquid crystal layer, the first array substrate, the second shielding layer, the second opposite substrate, the second liquid crystal layer, and the second array substrate are sequentially arranged in the direction perpendicular to the first surface;

two ends of the first conductive structure are respectively in direct contact with the first array substrate and the first shielding layer; and two ends of the second conductive structure are respectively in direct contact with the second array substrate and the second shielding layer.

10. The display module according to claim 1, wherein in a second direction crossing the first direction, a length of the at least one first flexible circuit board is smaller than a length of the at least one second flexible circuit board.

11. The display module according to claim 2, wherein the display panel comprises a plurality of first connection lines and a plurality of first signal lines;

each of the plurality of first connection lines comprises a first wire portion, a second wire portion, and a third wire portion which are sequentially connected;

the first wire portion is electrically connected to a corresponding first signal line, and the third wire portion is electrically connected to a corresponding first flexible circuit board;

the light control panel comprises a plurality of second connection lines and a plurality of second signal lines;

each of the plurality of second connection lines comprises a fourth wire portion, a fifth wire portion, and a sixth wire portion which are sequentially connected;

the fourth wire portion is electrically connected to a corresponding second signal line, and the sixth wire portion is electrically connected to a corresponding second flexible circuit board;

lengths of second wire portions of at least part of the plurality of first connection lines in the first direction changes at a first change rate;

lengths of fifth wire portions of at least part of the plurality of second connection lines in the first direction changes at a second change rate;

the first change rate is smaller than the second change rate; and each of the plurality of first signal lines extends in a second direction crossing the first direction as a whole.

12. The display module according to claim 11, wherein each of the first wire portion, the third wire portion, the fourth wire portion, and the sixth wire portion extends in the second direction as a whole, and each of the second wire portion and the fifth wire portion extends in a direction crossing both the first direction and the second direction as a whole.

13. The display module according to claim 11, wherein the display panel further comprises a first common electrode in a peripheral region of the display module;

the light control panel further comprises a second common electrode in the peripheral region of the display module;

the display module comprises a first side and a second side opposite to each other in the first direction;

two outermost first connection lines among the plurality of first connection lines comprise a first connection line on the first side and a first connection line on the second side;

two outermost second connection lines among the plurality of second connection lines comprise a second connection line on the first side and a second connection line on the second side;

a distance between a second wire portion of the first connection line on the first side and an edge of the first common electrode close to the first connection line on the first side is a first distance;

a distance between a second wire portion of the first connection line on the second side and an edge of the first common electrode close to the first connection line on the second side is a second distance;

a distance between a fifth wire portion of the second connection line on the first side and an edge of the second common electrode close to the second connection line on the first side is a third distance; and a distance between a fifth wire portion of the second connection line on the second side and an edge of the second common electrode close to the second connection line on the second side is a fourth distance.

14. The display module according to claim 13, wherein a product of a difference between the first distance and the second distance and a difference between the third distance and the fourth distance is a positive value.

15. The display module according to claim 1, wherein the display panel comprises a third common electrode at least partially in a display region of the display module, and the third common electrode further serves as at least part of a touch electrode of the display module.

16. The display module according to claim 15, further comprising at least one first flexible circuit board, wherein the third common electrode comprises a plurality of self-capacitance electrodes arranged in an array;

the display panel further comprises a plurality of first touch wires;

the at least one first flexible circuit board comprises a plurality of third wires; and first ends of the plurality of third wires are electrically connected to the plurality of self-capacitance electrodes arranged in an array through the plurality of first touch wires.

17. The display module according to claim 15, wherein the light control panel comprises a fourth common electrode at least partially in the display region of the display module;

the fourth common electrode comprises a plurality of second strip-shaped electrodes arranged side by side in the first direction;

the third common electrode comprises a plurality of first strip-shaped electrodes arranged side by side in a second direction crossing the first direction; and the plurality of first strip-shaped electrodes and the plurality of second strip-shaped electrodes, as a whole, serve as touch electrodes based on mutual capacitance.

18. The display module according to claim 17, wherein the display panel further comprises a first liquid crystal layer, and the light control panel further comprises a second liquid crystal layer; and the third common electrode and the fourth common electrode are between the first liquid crystal layer and the second liquid crystal layer.

19. The display module according to claim 18, wherein the display panel comprises a first array substrate and a first opposite substrate;

the light control panel comprises a second array substrate and a second opposite substrate; and the third common electrode and the fourth common electrode are respectively in the first opposite substrate and the second opposite substrate, or the third common electrode and the fourth common electrode are respectively in the first array substrate and the second array substrate.

\* \* \* \* \*